(12) United States Patent
Southwell et al.

(10) Patent No.: US 8,501,033 B2
(45) Date of Patent: Aug. 6, 2013

(54) RADIATION CURABLE RESIN COMPOSITION AND RAPID THREE-DIMENSIONAL IMAGING PROCESS USING THE SAME

(75) Inventors: John Southwell, Glen Ellyn, IL (US); Brett A. Register, Wonder Lake, IL (US); Satyendra Kumar Sarmah, Chicago, IL (US); Paulus Antonius Maria Steeman, Spaubeek (NL); Beert Jacobus Keestra, Waalre (NL); Marcus Matheus Driessen, Maasbracht (NL)

(73) Assignee: DSM IP Assets B.V., Heerlen (NL)

( * ) Notice: Subject to any disclaimer, the term of this patent is extended or adjusted under 35 U.S.C. 154(b) by 272 days.

(21) Appl. No.: 13/001,655

(22) PCT Filed: Mar. 12, 2010

(86) PCT No.: PCT/US2010/000760
§ 371 (c)(1),
(2), (4) Date: Dec. 28, 2010

(87) PCT Pub. No.: WO2010/104603
PCT Pub. Date: Sep. 16, 2010

(65) Prior Publication Data
US 2011/0104500 A1    May 5, 2011

Related U.S. Application Data

(60) Provisional application No. 61/160,232, filed on Mar. 13, 2009, provisional application No. 61/162,233, filed on Mar. 20, 2009.

(51) Int. Cl.
*C09K 3/00* (2006.01)
*C08F 20/18* (2006.01)
*C08F 20/10* (2006.01)
*C08F 32/04* (2006.01)

(52) U.S. Cl.
USPC ............ 252/182.13; 252/182.11; 252/182.12; 252/183.11; 524/599; 524/612; 526/317.1; 526/318; 526/309

(58) Field of Classification Search
USPC ............. 106/182.11, 182.12, 182.13, 183.11; 526/317.1, 318, 309; 524/599, 612; 252/182.11, 252/182.12, 182.13, 183.11
See application file for complete search history.

(56) References Cited

U.S. PATENT DOCUMENTS

| | | | |
|---|---|---|---|
| 6,287,745 B1 | 9/2001 | Yamamura et al. | |
| 6,727,035 B2 | 4/2004 | Yamamura et al. | |
| 6,730,734 B1 | 5/2004 | Hamilton et al. | |
| 6,894,113 B2 | 5/2005 | Court et al. | |
| 2002/0132872 A1 | 9/2002 | Yamamura et al. | |
| 2003/0149189 A1 | 8/2003 | Cheung et al. | |
| 2003/0207959 A1 | 11/2003 | Napadensky et al. | |
| 2004/0034124 A1 | 2/2004 | Court et al. | |
| 2004/0137368 A1 | 7/2004 | Steinmann | |

FOREIGN PATENT DOCUMENTS

| | | |
|---|---|---|
| EP | 0 646 580 A2 | 9/1994 |
| EP | 0 938 026 A1 | 8/1999 |
| EP | 1 437 624 A1 | 7/2004 |
| EP | 1 939 234 | 7/2008 |
| JP | 04300954 A2 | 10/1992 |
| JP | 11240939 A2 | 9/1999 |
| JP | 2003-192887 A2 | 7/2003 |
| JP | 2003-238691 A2 | 8/2003 |
| WO | WO 00/63272 | 10/2000 |
| WO | WO 01/75524 A2 | 10/2001 |
| WO | WO 03/093901 | 11/2003 |
| WO | WO 2007/048819 | 5/2007 |
| WO | WO 2007/124911 | 11/2007 |
| WO | WO 2007124911 | * 11/2007 |
| WO | WO 2008/115057 | 9/2008 |

OTHER PUBLICATIONS

International Search Report for PCT/US2010/000760, dated Sep. 22, 2010.
International Search Report for PCT/EP2007/003676, mailed Aug. 9, 2007; 5 pgs.
Fine et al., "Structures and rheological properties of reactive solutions of block copolymers, Part I, Diblock copolymers in a liquid epoxy monomer," Polymer, vol. 46, May 23, 2005; pp. 6605-6613.
Office Action in related Japanese Application No. P2009-508176; Dispatch Date: Jun. 5, 2012; 11 pages; In Japanese with English Translation.
Office Action in related U.S. Appl. No. 13/553,193; Notification Date: Sep. 13, 2012; 12 Pgs.
Office Action in related U.S. Appl. No. 12/667,108; Notification Date: Jan. 20, 2012; 15 Pgs.
Office Action in related U.S. Appl. No. 12/667,108; Notification Date: Aug. 29, 2012; 18 Pgs.
International Preliminary Report on Patentability with Written Opinion in corresponding PCT application No. PCT/US2010/000760 mailed Sep. 22, 2011 (7 pages).

* cited by examiner

*Primary Examiner* — Karuna P Reddy
(74) *Attorney, Agent, or Firm* — Nixon & Vanderhye PC

(57) ABSTRACT

The invention relates to a liquid radiation curable resin capable of curing into a solid upon irradiation comprising: (A) from about 0 to about 12 wt % of a cycloaliphatic epoxide having a linking ester group; (B) from about 30 to about 65 wt % of one or more epoxy functional components other than A; (C) from about 10 to about 30 wt % of one or more oxetanes; (D) from, about 1 to about 10 wt % of one or more polyols; (E) from about 2 to about 20 wt % of one or more radically curable (meth)acrylate components; (F) from about 2 to about 12 wt % of one or more impact modifiers; (G) from about 0.1 to about 8 wt % of one or more free radical photoinitiators; and (H) from about 0.1 to about 8 wt % of one or more cationic photoinitiators; wherein the liquid radiation curable resin has a viscosity at 30° C. of from about 600 cps to about 1300 cps.

21 Claims, No Drawings

RADIATION CURABLE RESIN COMPOSITION AND RAPID THREE-DIMENSIONAL IMAGING PROCESS USING THE SAME

This application is the U.S. national phase of International Application No. PCT/US2010/000760 filed 12 Mar. 2010 which designated the U.S. and claims priority to U.S. Provisional Application Nos. 61/160,232 filed 13 Mar. 2009 and 61/162,233 filed 20 Mar. 2009, the entire contents of each of which are hereby incorporated by reference.

FIELD OF THE INVENTION

The present invention relates to radiation curable resins suitable for use in forming three dimensional articles using stereolithography and other processes.

BACKGROUND OF THE INVENTION

The production of three-dimensional articles of complex shape by means of stereolithography has been known for a number of years. In this technique the desired shaped article is built up layer by layer from a liquid radiation curable resin with the aid of a recurring, alternating sequence of two steps (a) and (b). In step (a), a layer of the liquid radiation curable resin, one boundary of which is the surface of the resin, is cured with the aid of appropriate imaging radiation, preferably imaging radiation from a computer-controlled scanning laser beam, within a surface region which corresponds to the desired cross-sectional area of the shaped article to be formed, and in step (b) the cured layer is covered with a new layer of the liquid radiation curable resin, and the sequence of steps (a) and (b) is repeated until a so-called green model of the desired shape is finished. This green model is, in general, not yet fully cured and may therefore be subjected to post-curing, though such postcuring is not required.

Via an equivalent process, photopolymer can be jetted by inkjet or multiple ink jet processes in an imagewise fashion. While jetting the photopolymer or after the photopolymer is applied, actinic exposure of radiation can be provided in the form of a laser or other light source to initiate polymerization. Multiple materials (for example non-reactive waxes, weakly reacting photopolymers, photopolymers of various physical properties, photopolymers with various colors or color formers, etc.) can be jetted or applied to provide supports or alternate cured properties. An alternative process is Digital Light Processing, wherein an entire layer can be radiation cured simultaneously.

The stereolithography industry demands faster and faster build times. In order to reduce the time to build a part via a stereolithography process, modern stereolithography machines require a more versatile liquid radiation curable resin composition. Modern stereolithography machines have solid state lasers that have a high energy output, very fast laser-scanning and faster recoating processes. These new machines supply UV radiation with a power around 800 mW and above, compared to 200-300 mW for older conventional stereolithography machines. As compared to older machines the scanning time is reduced by up to 4 times. These high powers, high scanning speeds, and short recoating times result in higher temperatures, due to the exothermic polymerization of the resins and parts during fabrication. Typical temperatures at the build surface have risen to values between 50° C. and 90° C. These high temperatures may lead to part distortion and excessive color development in resins that are not specifically formulated to tolerate these high temperatures.

The stereolithography industry demands liquid radiation curable resins that are highly workable in modern stereolithography machines. Workability is determined by several properties of either the liquid radiation curable resin or the cured three-dimensional article. Primarily, these properties include viscosity and green strength.

A resin with high viscosity will, for example, make the recoating step of the stereolithography process more difficult and time consuming. This is due to the difficulty of recoating a high viscosity liquid and to the increased time it takes a high viscosity liquid to equilibrate after performing the recoating step. Moreover, a cured three-dimensional article made with a high viscosity liquid radiation curable resin will be more difficult to clean from "green" parts after the stereolithography process is complete.

The green strength of the cured three-dimensional article is the mechanical strength of the article immediately after curing. The cured three-dimensional article continues to build up its strength over a period of time after initial curing to eventually achieve its final mechanical properties. Moreover, liquid radiation curable resins that result in cured three-dimensional articles with a low heat deflection temperature can produce cured three-dimensional articles that are subject to curl and shrinkage during a modern stereolithography process. It is therefore difficult but necessary to balance the need for high heat deflection temperature in the finished SL part and workability in a stereolithography machine.

Ductility is a mechanical property used to describe the extent to which materials can be deformed plastically without fracture. In materials science, ductility specifically refers to a material's ability to deform under tensile stress before fracturing. Matrix ductility refers specifically to the ductility of the photopolymer matrix in which an impact modifier may be dispersed (e.g. all components of the SL composition excluding the impact modifier).

The matrix ductility and impact strength of a cured three-dimensional article made from a liquid radiation curable resin can be increased by reducing the crosslink density of the cured three-dimensional article, especially in addition to the use of impact modifiers. Please see, for example: Meeks, A. C. "Fracture and mechanical properties of epoxy resin and rubber-modified epoxies" Polymer, 1974, m15, 675-681; Huang, Y., Kinloch, A. J. "Modeling of the toughening mechanisms in rubber-modified epoxy polymers," J. Mater. Sci. 1992, 27, 2753-2762; Kinloch, A. J., Finch, C. A., Hashemi, S. "Effect of segmental molecular mass between crosslinks of the matrix phase on the toughness of rubber-modified epoxies," Polym. Commun. 1987, 28, 322-325; and Pearson, R. A., Yee, A. F. "Toughening mechanisms in elastomer-modified epoxies: Part 3: The effect of crosslink density," J. Mater. Sci. 1989, 24, 2571-2580. Reducing the crosslink density of the cured three-dimensional article by manipulating the formulation of the liquid radiation curable resin using methods known in the field most often leads to an increase in viscosity of the liquid radiation curable resin, thus reducing the overall workability of the liquid radiation curable resin. Therefore, there is a need in the field of liquid radiation curable resin for stereolithography resins that attain high impact strength while still allowing for good workability in modern stereolithography machines.

Moreover, the stereolithography industry desires liquid radiation curable resin compositions capable of curing into cured three-dimensional articles that possess a number of other excellent properties. These properties are primarily a high mechanical strength, high heat deflection temperature, and low water absorption. Often, if a stereolithography resin formulator attempts to increase one property of the liquid radiation curable resin or the cured three-dimensional article it produces, another property of the resin or cured three-dimensional article is sacrificed. For instance, matrix ductility and impact strength may be increased by using hydroxyl functional chain transfer agents, but at the cost of increasing the water absorption behavior in the cured article. The stereolithography resin formulator is thus challenged to formulate a resin that has acceptable viscosity in liquid form for use in modern stereolithography processes and produces a cured three-dimensional article possessing desirable impact strength, mechanical strength, heat deflection temperature, and water absorption.

Meeting the challenges of producing liquid radiation curable resin compositions is described in, for example, European Patent 1171502, assigned to DSM IP Assets B.V. This patent does not disclose any formulations with the aforementioned combination of desirable properties.

U.S. Pat. No. 6,833,231, entitled "Toughened Stereolithographic Resin Compositions" and assigned to 3D Systems, Inc., discloses certain stereolithographic resin compositions that do not have the aforementioned combination of desirable properties.

U.S. Pat. No. 7,183,040, assigned to DSM IP Assets B.V., discloses liquid radiation curable resin compositions with excellent water uptake resistance, but without a desirable combination of heat deflection temperature, impact strength, and modulus.

U.S. Pat. No. 5,972,563, assigned to Ciba Specialty Chemicals Corp., discloses liquid radiation curable compositions without a highly desirable combination of properties. Specifically, the three-dimensional articles formed from the disclosed combinations have a high degree of water uptake.

U.S. Pat. No. 6,287,745, assigned to DSM IP Assets B.V., JSR Corporation, and Japan Fine Coatings Co., discloses liquid radiation curable resins, but the disclosed resins produce articles with an undesirable amount of water uptake.

U.S. Pat. No. 7,232,850, assigned to Huntsman Advanced Materials, discloses photocurable compositions that do not possess the aforementioned desirable combination of properties.

U.S. Patent Application 2003/0198824, U.S. Pat. No. 6,989,225 (U.S. Patent Application 2004/0013977), U.S. Patent Application 2004/0137368 (EP 1437624), EP 0831127, and WO/2000/063272 all disclose liquid radiation curable resins without the aforementioned desirable combination of properties.

WO 2007/124911 and WO 2008/115057 disclose liquid radiation curable resins that produce articles with excellent impact resistance. However, the liquid radiation curable resins disclosed by these publications have high viscosity and produce articles that do not possess desirable water absorption and heat deflection temperature characteristics.

Several other issued patents and published patent applications are known that describe resin compositions that can be used in rapid prototyping and aim at improving mechanical properties of the three dimensional articles. Examples of such issued patents and published patent applications are EP 831127, EP 848294, EP 938026, EP 1437624, JP 2003-238691, U.S. Pat. No. 6,833,231, US2003-198824, US 2004-013977, US 2005-072519, US 2005-0175925, WO 9950711, WO 0063272, WO 04111733 and WO 04113395. However, these publications do not disclose stereolithography resins with the desired combination of viscosity, and the cured article properties of modulus, impact resistance, heat deflection temperature, and water resistance.

It would thus be desirable to develop a liquid radiation curable resin composition that is capable of forming a cured three-dimensional article that possess a desirable combination of modulus, impact strength, heat deflection temperature, and water absorption while still exhibiting the desired viscosity that allows for excellent workability in modern stereolithography machines.

SUMMARY OF THE INVENTION

The first aspect of the instant claimed invention is a liquid radiation curable resin comprising:
A. From about 0 to about 12 wt % of a cycloaliphatic epoxide having a linking ester group;
B. From about 30 to about 65 wt % of one or more epoxy functional components, wherein element B is not the same as element A;
C. From about 10 to about 30 wt % of one or more oxetanes;
D. From about 1 to about 10 wt % of one or more polyols;
E. From about 2 to about 20 wt % of one or more radically curable (meth)acrylate components;
F. From about 2 to about 12 wt % of one or more impact modifiers;
G. From about 0.1 to about 8 wt % of one or more free radical photoinitiators; and
H. From about 0.1 to about 8 wt % of one or more cationic photoinitiators;
wherein the liquid radiation curable resin has a viscosity at 30° C. of from about 600 cps to about 1300 cps.

The second aspect of the instant claimed invention is a process for making a three-dimensional article comprising the steps of
(1) providing a liquid radiation curable resin;
(2) providing a stereolithography machine;
(3) coating a layer of a liquid radiation curable resin onto a surface;
(4) exposing said layer imagewise to actinic radiation to form a first exposed imaged cross-section, wherein the radiation is of sufficient intensity and time to cause substantial curing of the layer in the exposed areas;
(5) coating an additional layer of the liquid radiation curable resin onto the previously exposed imaged cross-section;
(6) exposing said additional layer imagewise to actinic radiation to form an additional imaged cross-section, wherein the radiation is of sufficient intensity and time to cause substantial curing of the second layer in the exposed areas and to cause adhesion to the previously exposed imaged cross-section; and
(7) repeating steps (5) and (6) a desired number of times to build up the three-dimensional article,
wherein the liquid radiation curable resin is that resin of the first aspect of the instant claimed invention.

The third aspect of the instant claimed invention is a three-dimensional article made via a stereolithography process that, after full cure, has a Young's modulus of from about 2 GPa to about 3 GPa, a notched Izod impact strength of from about 0.30 J/cm to about 0.60 J/cm, a heat deflection temperature from about 40° C. to about 65° C., and a 24-hour water absorption value from about 0.2 weight % to about 0.7 weight %.

DETAILED DESCRIPTION OF THE INVENTION

The first aspect of the instant claimed invention is a liquid radiation curable resin comprising:

A. From about 0 to about 12 wt % of a cycloaliphatic epoxide having a linking ester group;
B. From about 30 to about 65 wt % of one or more epoxy functional components, wherein element B is not the same as element A;
C. From about 10 to about 30 wt % of one or more oxetanes;
D. From about 1 to about 10 wt % of one or more polyols;
E. From about 2 to about 20 wt % of one or more radically curable (meth)acrylate components;
F. From about 2 to about 12 wt % of one or more impact modifiers;
G. From about 0.1 to about 8 wt % of one or more free radical photoinitiators; and
H. From about 0.1 to about 8 wt % of one or more cationic photoinitiators;
wherein the liquid radiation curable resin has a viscosity at 30° C. of from about 600 cps to about 1300 cps.

The weight percentages of each element as used throughout this application are relative to the total weight of the composition, unless stated otherwise.

The combination of the eight claimed ingredients to produce a liquid radiation curable resin with a viscosity below 1300 cps that is capable of being cured into a cured three-dimensional article that, after full cure, has a modulus of greater than about 2 GPa, a notched Izod impact strength of greater than about 0.30 J/cm, a heat deflection temperature of greater than about 40° C., and a 24-hour water uptake of less than 0.70% weight gain in combination is not known. The selection of the components of the liquid radiation curable resin is critical to achieving this desired combination of physical properties. If each component is not present in the appropriate amount, it is not possible to achieve the desired combination of physical properties.

In accordance with the first aspect of the instant claimed invention, a description of the individual components follows.

(A) Cycloaliphatic Epoxide Having a Linking Ester Group

Element A of the first aspect of the instant claimed invention is a cycloaliphatic epoxide having a linking ester group. Cycloaliphatic epoxides having one or more linking ester groups generally contribute to many beneficial properties of a liquid radiation curable resin. Namely, these beneficial properties are the viscosity of the liquid radiation curable resin and the impact strength of cured three-dimensional articles made therefrom. However, it is believed that the presence of a high amount of cycloaliphatic epoxide having a linking ester group in a liquid radiation curable resin produces cured three-dimensional articles that perform unfavorably in the presence of moisture. The aliphatic linking ester groups are believed to be hydrolytically unstable in the presence of acids. This may cause a reduction in the mechanical properties and a reduction in the dimensional stability of the cured three-dimensional article over time, especially in moist or high humidity environments. Accordingly, in the present invention the amount of cycloaliphatic epoxide having a linking ester group is limited.

In an embodiment, an epoxide is 3,4-epoxycyclohexylmethyl-3',4-epoxycyclohexanecarboxylate (available as CELLOXIDE™ 2021P from Daicel Chemical, or as CYRACURE™ UVR-6105 from Dow Chemical). Another example of such a cycloaliphatic epoxide with a linking ester group is bis((3,4-epoxycyclohexyl)methyl)adipate (available as UVR-6128 from Dow Chemical).

Therefore, in an embodiment, the amount of cycloaliphatic epoxide with a linking ester group is preferably below about 12 wt %, more preferably below about 10 wt %, and even more preferably below about 9 wt %. In other embodiments, the amount of cycloaliphatic epoxide having a linking ester group is below about 8.6 wt % or below about 9.2 wt %. In embodiments, the amount of cycloaliphatic epoxide having a linking ester group is greater than about 0 wt %, greater than about 5 wt %, greater than about 7.3 wt %, greater than about 8.7 wt %, or greater than about 9 wt %. In another embodiment, the amount of cycloaliphatic epoxide with a linking ester group is from about 0 wt % to about 12 wt %, preferably about 5 wt % to about 12 wt %, more preferably from about 5 wt % to about 10 wt %, and even more preferably from about 5 wt % to about 9 wt %. In other embodiments, the amount of cycloaliphatic epoxide having a linking ester group is from about 0 to about 8.6 wt % or from about 0 to about 9.2 wt %. In other embodiments, the amount of cycloaliphatic epoxide having a linking ester group is from about 5 wt % to about 8.6 wt % or from about 5 wt % to about 9.2 wt %. In other embodiments, the amount of cycloaliphatic epoxide is from about 7.3 wt % to about 8.6 wt %, from about 7.3 wt % to about 9 wt %, from about 7.3 wt % to about 9.2 wt %, from about 7.3 wt % to about 10 wt %, or from about 7.3 wt % to about 12 wt %. In other embodiments, the amount of cycloaliphatic epoxide is from about 8.7 wt % to about 9 wt %, from about 8.7 wt % to about 9.2 wt %, from about 8.7 wt % to about 10 wt %, or from about 8.7 wt % to about 12 wt %. In other embodiments, the amount of cycloaliphatic epoxide having a linking ester group is about 8.6 wt %, about 8.7 wt %, about 7 wt %, about 7.5 wt %, or about 9.2 wt %.

(B) Epoxy Functional Components Other than (A)

Element B of the first aspect of the instant claimed invention is an epoxy functional component, wherein element B is not the same as element A. The composition of the instant claimed invention contains at least one epoxy-group containing component. Generally, the function of an epoxide in a liquid radiation curable resin is to develop the final properties of the cured three-dimensional article. However, epoxide components of a liquid radiation curable resin polymerize slower than radically polymerizable substances such as acrylates. See *UV-radiation curing of acrylate/epoxide systems*, Decker et al, Polymer, June 2001, 5531-5541. Therefore, the contribution of epoxides to the green strength of the cured three-dimensional article is less than that of the radically polymerizable components.

The epoxide-containing components that are used in the compositions, according to element B of the first aspect of the instant claimed invention, are compounds that possess on average at least one 1,2-epoxide group in the molecule. By "epoxide" is meant the three-membered ring shown by the following formula (1):

The epoxide-containing components, also referred to as epoxy materials, are cationically curable, by which is meant that polymerization and/or crosslinking and other reaction of the epoxy group is initiated by cations. The materials can be monomeric, oligomeric or polymeric and are sometimes referred to as "resins." Such materials may have an aliphatic, aromatic, cycloaliphatic, arylaliphatic or heterocyclic structure; they comprise epoxide groups as separate groups, or those groups form part of an alicyclic or heterocyclic ring system. Epoxy resins of those types are generally known and are commercially available. The epoxide-containing material can be a single liquid epoxy material, a combination of liquid epoxy materials, or a combination of liquid epoxy material(s) and solid epoxy material(s) which is soluble in the liquid.

Examples of suitable epoxy materials include polyglycidyl and poly(methylglycidyl) esters of polycarboxylic acids, or poly(oxiranyl)ethers of polyethers. The polycarboxylic acid can be aliphatic, such as, for example, glutaric acid, adipic acid and the like; cycloaliphatic, such as, for example, tetrahydrophthalic acid; or aromatic, such as, for example, phthalic acid, isophthalic acid, trimellitic acid, or pyromellitic acid. The polyether can be polytetramethylene oxide. It is likewise possible to use carboxyterminated adducts, for example, of trimellitic acid and polyols, such as, for example, glycerol or 2,2-bis(4-hydroxycyclohexyl)propane.

Suitable epoxy materials also include polyglycidyl or poly (-methylglycidyl)ethers obtainable by the reaction of a compound having at least one free alcoholic hydroxy groups and/or phenolic hydroxy groups and a suitably substituted epichlorohydrin. The alcohols can be acyclic alcohols, such as, for example, ethylene glycol, diethylene glycol, and higher poly(oxyethylene) glycols; cycloaliphatic, such as, for example, 1,3- or 1,4-dihydroxycyclohexane, bis(4-hydroxycyclohexyl)methane, 2,2-bis(4-hydroxycyclohexyl)propane, or 1,1-bis(hydroxymethyl)cyclohex-3-ene; or contain aromatic nuclei, such as N,N-bis(2-hydroxyethyl)aniline or p,p'-bis(2-hydroxyethylamino)diphenylmethane.

The epoxy compounds may also be derived from mononuclear phenols, such as, for example, from resorcinol or hydroquinone, or they may be based on polynuclear phenols, such as, for example, bis(4-hydroxyphenyl)methane (bisphenol F), 2,2-bis(4-hydroxyphenyl)propane (bisphenol A), or on condensation products, obtained under acidic conditions, of phenols or cresols with formaldehyde, such as phenol novolacs and cresol novolacs.

Examples of suitable epoxy materials include poly(S-glycidyl) compounds which are di-S-glycidyl derivatives which are derived from dithiols, such as, for example, ethane-1,2-dithiol or bis(4-mercaptomethylphenyl)ether.

Other examples of suitable epoxy materials include bis(2, 3-epoxycyclopentyl)ether, 2,3-epoxy cyclopentyl glycidyl ether, 1,2-bis(2,3-epoxycyclopentyloxy)ethane, bis(4-hydroxycyclohexyl)methane diglycidyl ether (EPONOX™ 1510), 2,2-bis(4-hydroxycyclohexyl)propane diglycidyl ether, 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, di(3,4-epoxycyclohexylmethyl)hexanedioate, di(3,4-epoxy-6-methylcyclohexylmethyl)hexanedioate, ethylenebis(3,4-epoxycyclohexanecarboxylate), ethanedioldi(3,4-epoxycyclohexylmethyl)ether, vinylcyclohexene dioxide, dicyclopentadiene diepoxide, α-(oxiranylmethyl)-ω-(oxiranylmethoxy)poly(oxy-1,4-butanediyl), diglycidyl ether of neopentyl glycol, or 2-(3,4-epoxycyclohexyl-5,5-spiro-3,4-epoxy)cyclohexane-1,3-dioxane, and combinations thereof.

It is also possible to use epoxy resins in which the 1,2-epoxy groups are bonded to different heteroatoms or functional groups. Those compounds include, for example, the N,N,O-triglycidyl derivative of 4-aminophenol, the glycidyl ether glycidyl ester of salicylic acid, N-glycidyl-N'-(2-glycidyloxypropyl)-5,5-dimethylhydantoin, or 2-glycidyloxy-1, 3-bis(5,5-dimethyl-1-glycidylhydantoin-3-yl)propane.

In an embodiment, an epoxide is hydrogenated bisphenol A-epichlorohydrin based epoxy resin (available as EPONEX™ 1510 from Hexion), 1,4-cyclohexanedimethanol diglycidyl ether (available as HELOXY™ 107 from Hexion), a mixture of dicyclohexyl diepoxide and nanosilica (available as NANOPDX™), and any combination thereof.

In an embodiment the epoxide is based on polynuclear phenols, such as, for example, bis(4-hydroxyphenyl)methane (bisphenol F), 2,2-bis(4-hydroxyphenyl)propane (bisphenol A) or oligomers thereof. In an embodiment, an epoxy material based on a polynuclear phenol is the component shown by formula (2):

(2)

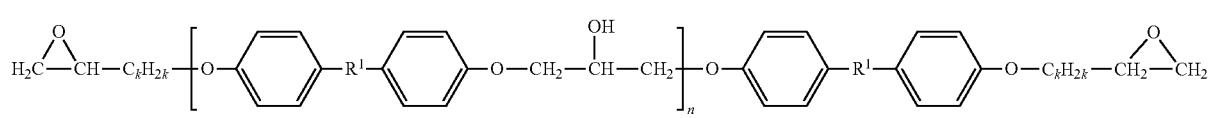

wherein $R^1$ represents any one of —C(CH$_3$)$_2$—, —CH$_2$—, or —SO$_2$—, k represents an integer from 1 to 4, and n represents an integer from 1 to 10. This component is commercially available as Epicoat 834, 1001, 1002, 1003, 1004, 1055, 1003F, 1004F, and 1005F from Japan Epoxy Resins Co., Ltd.

In an embodiment an epoxide is a mono-functional epoxy with an ethylhexyl chain. Inclusion of such an epoxide has the effect of decreasing the crosslink density of a cured three-dimensional article made from a liquid radiation curable resin. The decrease in crosslink density has the effect of increasing the impact strength of the cured three-dimensional article. Moreover, use of this component has the effect of increasing the resistance to water absorption of the three-dimensional article due to the hydrophobic ethylhexyl chain.

Use of a mono-functional epoxide with an ethylhexyl chain generally lowers the viscosity of the liquid radiation curable resin. However, use of this component decreases the $T_g$ of the liquid radiation curable resin. Therefore, use of such a component must be finely balanced in formulating a liquid radiation curable resin. In an embodiment, a mono-functional epoxy with an ethylhexyl chain is 7-Oxabicyclo[4.1.0]heptane 3-carboxylic acid, 2-ethylhexyl ester (available as DCE 410 from Dixie Chemical).

In an embodiment the amount of mono-functional epoxide with an ethylhexyl chain is less than about 2.0 wt %, preferably less than about 1.0 wt %, and more preferably about 0.75 wt %. In another embodiment the amount of mono-functional epoxide with an ethylhexyl chain is greater than about 0.25 wt %, preferably greater than about 0.5 wt %. In other embodiments, the amount of mono-functional epoxide with an ethylhexyl chain is from about 0.25 to about 1.0 wt %, more preferably from about 0.5 to about 1.0 wt %.

The epoxy materials can have molecular weights which vary over a wide range. In general, the epoxy equivalent weight, i.e., the number average molecular weight divided by the number of reactive epoxy groups, is preferably in the range of 44 to 1000 g/mol.

In addition, liquid pre-reacted adducts of such epoxy resins with hardeners are suitable for epoxy resins.

The above-mentioned epoxy functional components that are not the same as element A can be used singly or in combination of two or more thereof.

In an embodiment, the amount of epoxy functional component other than element A is greater than about 30 wt % or about 35 wt %. In an embodiment, the amount of epoxy functional component other than element A is less than about 65 wt %, about 50 wt %, or about 45 wt %. In an embodiment, the amount of epoxy functional component other than element A is from about 30 to about 65 wt %. In another embodiment, the amount of epoxy functional component other than element A is from about 30 to about 50 wt %. In a further embodiment, the amount of epoxy functional component other than element A is from about 30 to about 45 wt %. In a further embodiment, the amount of epoxy functional component other than element A is from about 35 to about 65 wt %, preferably from about 35 to about 50 wt %, and more preferably from about 35 to about 45 wt %.

(C) Oxetane Functional Components

Element C of the first aspect of the instant claimed invention is one or more oxetanes. An oxetane compound comprises at least one oxetane ring shown by the following formula (3):

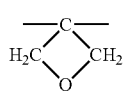

(3)

The oxetane compound can be polymerized or crosslinked by irradiation with light in the presence of a cationically polymerizable photoinitiator. Examples of oxetanes having one oxetane ring in the molecule are shown by the following formula (4):

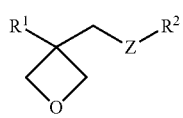

(4)

wherein Z represents an oxygen atom or sulphur atom; $R^1$ represents a hydrogen atom, fluorine atom, an alkyl group having 1-6 carbon atoms such as a methyl group, ethyl group, propyl group, and butyl group, a fluoroalkyl group having 1-6 carbon atoms such as trifluoromethyl group, perfluoroethyl group, and perfluoropropyl group, an aryl group having 6-18 carbon atoms such as a phenyl group and naphthyl group, a furyl group, or a thienyl group; and $R^2$ represents a hydrogen atom, an alkyl group having 1-6 carbon atoms for example a methyl group, ethyl group, propyl group, and butyl group, an alkenyl group having 2-6 carbon atoms for example a 1-propenyl group, 2-propenyl group, 2-methyl-1-propenyl group, 2-methyl-2-propenyl group, 1-butenyl group, 2-butenyl group, and 3-butenyl group, an aryl group having 6-18 carbon atoms for example a phenyl group, naphthyl group, anthranyl group, and phenanthryl group, a substituted or unsubstituted aralkyl group having 7-18 carbon atoms for example a benzyl group, fluorobenzyl group, methoxy benzyl group, phenethyl group, styryl group, cynnamyl group, ethoxybenzyl group, a group having other aromatic rings for instance an aryloxyalkyl for example a phenoxymethyl group and phenoxyethyl group, an alkylcarbonyl group having 2-6 carbon atoms for example an ethylcarbonyl group, propylcarbonyl group, butylcarbonyl group, an alkoxy carbonyl group having 2-6 carbon atoms for example an ethoxycarbonyl group, propoxycarbonyl group, butoxycarbonyl group, an N-alkylcarbamoyl group having 2-6 carbon atoms such as an ethylcarbamoyl group, propylcarbamoyl group, butylcarbamoyl group, pentylcarbamoyl group, or a polyether group having 2-1000 carbon atoms.

In an embodiment, the one or more oxetane functional components comprises 3-ethyl-3-hydroxymethyl-oxetane (available as OXT-101 from Toagosei). In another embodiment, the one or more oxetane functional components comprises 3-ethyl-3-[(2-ethylhexyloxy)methyl]oxetane (available as OXT-212 or "EHOX" from Toagosei). OXT-212 is a monofunctional oxetane with an ethylhexyl chain. In an embodiment, the amount of monofunctional oxetane with an ethylhexyl chain is less than about 5.0 wt %, preferably less than about 1.0 wt %, and more preferably about 0.75 wt %. In other embodiments, the amount of monofunctional oxetane with an ethylhexyl chain is greater than about 0 wt %, greater than about 0.25 wt %, greater than about 0.5 wt %, or greater than about 1.0 wt %. In an embodiment, the amount of monofunctional oxetane with an ethylhexyl chain is from about 0 wt % too about 5 wt % or form about 0 wt % to about 1 wt %. In another embodiment, the amount of monofunctional oxetane with an ethylhexyl chain is from about 0.25 to about 5 wt %, from about 0.5 to about 5 wt %, or from about 1 to about 5 wt %. In other embodiment, the amount of monofunctional oxetane with an ethylhexyl chain is from about 0.25 to about 1 wt % or from about 0.5 to about 1 wt %.

Examples of oxetane compounds having two oxetane rings in the molecule are compounds shown by the following formula (5):

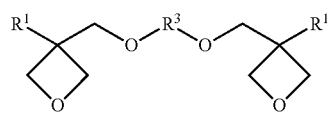

(5)

wherein $R^1$ is the same as defined for the above formula (4); $R^3$ represents a divalent organic group, like for example a linear or branched alkylene group having 1-20 carbon atoms for example an ethylene group, propylene group, and butylene group, a linear or branched poly(alkyleneoxy) group having 1-120 carbon atoms for example a poly(ethyleneoxy) group and poly(propyleneoxy) group, a linear or branched unsaturated hydrocarbon group for example a propenylene group, methylpropenylene group, and butenylene group.

The following formulas (6) and (7) show specific examples of the compounds having two oxetane rings in the molecule:

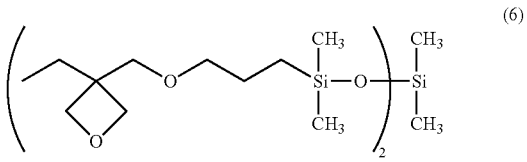

(6)

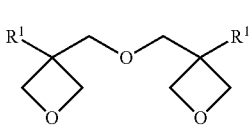

(7)

In formula (7), $R^1$ is the same as defined for the above formula (4).

Examples of other compounds containing one oxetane ring in the molecule are: 3-ethyl-3-hydroxymethyloxetane, 3-(meth)allyloxymethyl-3-ethyloxetane, (3-ethyl-3-oxetanylmethoxy)methylbenzene, (3-ethyl-3-oxetanylmethoxy)benzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl (3-ethyl-3-oxetanylmethyl)ether, isobornyloxyethyl (3-ethyl-3-oxetanylmethyl)ether, isobornyl (3-ethyl-3-oxetanylmethyl)ether, 2-ethylhexyl (3-ethyl-3-oxetanyl methyl)ether, ethyldiethylene glycol (3-ethyl-3-oxetanylmethyl)ether, dicyclopentadiene (3-ethyl-3-oxetanylmethyl)ether, dicyclopentenyloxyethyl (3-ethyl-3-oxetanyl methyl) ether, dicyclopentenyl (3-ethyl-3-oxetanylmethyl)ether, tetrahydrofurfuryl (3-ethyl-3-oxetanylmethyl) ether, tetrabromophenyl (3-ethyl-3-oxetanylmethyl)ether, 2-tetrabromophenoxyethyl (3-ethyl-3-oxetanylmethyl)ether, tribromophenyl (3-ethyl-3-oxetanylmethyl)ether, 2-tribromophenoxyethyl (3-ethyl-3-oxetanylmethyl)ether, 2-hydroxyethyl (3-ethyl-3-oxetanyl methyl)ether, 2-hydroxypropyl (3-ethyl-3-oxetanylmethyl)ether, butoxyethyl (3-ethyl-3-oxetanylmethyl)ether, pentachlorophenyl (3-ethyl-3-oxetanylmethyl)ether, pentabromophenyl (3-ethyl-3-oxetanylmethyl)ether, bornyl (3-ethyl-3-oxetanylmethyl)ether.

Examples of other compounds containing two or more oxetane rings in the molecule are: bis{[1-ethyl(3-oxetanyl)]methyl}ether (available as OXT-221 from Toagosei), 3,7-bis(3-oxetanyl)-5-oxa-nonane, 3,3'-(1,3-(2-methylenyl)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methy]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecanediyldimethylene (3-ethyl-3-oxetanylmethyl) ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A bis(3-ethyl-3-oxetanylmethyl)ether, PO-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, EO-modified bisphenol F (3-ethyl-3-oxetanylmethyl)ether. These compounds can be used either individually or in combination of two or more.

In certain embodiments, oxetanes are selected from the group consisting of components defined by formula 3, wherein $R^1$ is a C1-C4 alkyl group, Z=Oxygen and $R^2$=H, a C1-C8 alkyl group or a phenyl group; 3-ethyl-3-hydroxymethyloxetane, (3-ethyl-3-oxetanylmethoxy)methylbenzene, (3-ethyl-3-oxetanylmethoxy)benzene, 2-ethylhexyl (3-ethyl-3-oxetanyl methyl)ether, 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether and bis(3-ethyl-3-oxetanylmethyl)ether.

The oxetane compounds can be used either individually or in combinations of two or more.

In an embodiment, the amount of oxetane functional component is from greater than about 10 wt %, in another embodiment greater than about 15 wt %, and in another embodiment greater than about 17 wt %. In an embodiment, the amount of oxetane functional component the amount of oxetane functional component is less than about 30 wt %, in another embodiment less than 25 wt %, and in another embodiment less than 20 wt %. In an embodiment, the amount of oxetane functional component is about 10 wt % to about 30 wt %, preferably from about 15 to about 30 wt %. In another embodiment, the amount of oxetane functional component is between about 17 to about 30 wt %. In an embodiment, the amount of oxetane functional component is about 10 wt % to about 25 wt %, preferably from about 15 to about 25 wt %, or from about 17 to about 25 wt %. In an embodiment, the amount of oxetane functional component is about 10 wt % to about 20 wt %, preferably from about 15 to about 20 wt %. In another embodiment, the amount of oxetane functional component is between about 17 to about 20 wt %.

(D) Polyols (Hydroxy Functional Components)

Element D of the first aspect of the instant claimed invention is one or more polyols. A polyol used in the present invention is a polyol which contains at least one primary hydroxyl group. Primary hydroxyl groups are OH-groups, which are covalently bonded to a carbon atom having 2 or 3 hydrogen atoms. In an embodiment, the polyol contains two primary hydroxyl groups. In other embodiments, polyols are the ones having primary hydroxyl groups and/or secondary hydroxyl groups located at the terminus of an alkyl or alkoxy chain, wherein the alkyl of alkoxy chain may have from 1 to 100 C-atoms, in an embodiment from 2 to 50 C-atoms. While not wishing to be bound by any theory, we believe these primary and secondary polyols function as chain transfer agents in the cationic polymerization reaction.

The polyol may be a diol of number average molecular weight less than about 200 g/mol, wherein at least one, and, in an embodiment, both, hydroxyl groups are primary hydroxyl groups. Examples of suitable diols include: ethylene glycol, 1,2-propanediol, 1,3-propanediol, 1,3-butanediol, 1,4-butanediol, 1,5-pentanediol, 1,6-hexanediol, 1,7-heptanediol, 1,8-octanediol, 1,9-nonanediol, 1,10-decanediol, diethylene glycol, triethyleneglycol, tetraethylene glycol, dipropylene glycol and tripropylene glycol.

In an embodiment the polyol component is a molecule that has a central structure to which have been added chain extensions of, for example, ethylene oxide or propylene oxide. In an embodiment the polyol is an alkoxylated polyol or an alkoxylated aromatic diol. In other embodiments the polyol is an ethoxylated polyol or ethoxylated aromatic diol.

Examples of suitable polyols are oligomeric and polymeric hydroxyl-containing materials including polyoxyethylene and polyoxypropylene glycols and triols of number average molecular weights from about 200 to about 1500 g/mol; polytetramethylene glycols of varying molecular weight; poly(oxyethylene-oxybutylene) random or block copolymers; hydroxy-terminated polyesters and hydroxy-terminated polylactones; hydroxy-functionalized polyalkadienes, such as polybutadiene; aliphatic polycarbonate polyols, such as an aliphatic polycarbonate diol; hydroxy-terminated polyethers; and alkoxylated aromatic diols represented by the following formula (8):

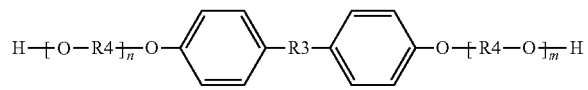

(8)

wherein R3=—CH$_2$—, —C(CH$_3$)$_2$—, —C(CF$_3$)$_2$—, —CCl$_2$—, —O—, —S—, and
R$^4$=—CH$_2$CH$_2$— or —CH$_2$CH(CH$_3$)—, and n and m are integers from 1 to 10.

In one embodiment of the invention, the hydroxy component comprises an ethoxylated bisphenol A. The ethoxylated bisphenol A may for example contain between 1 and 30 ethoxylations per hydroxyl group, in an embodiment, from 2 to 20 ethoxylations per hydroxyl group. In another embodiment of the invention, the hydroxy component comprises a propoxylated bisphenol A. The propoxylated bisphenol A may for example contain between 1 and 30 propoxylations per hydroxyl group, in an embodiment, from 2 to 20 propoxylations per hydroxyl group.

In yet another embodiment of the invention, the hydroxy component comprises a bisphenol A with mixed ethoxylations and propoxylations. This bisphenol A may for example contain in total between about 1 and about 30 ethoxylations and/or propoxylations per hydroxyl group, in an embodiment, from about 2 to about 20 ethoxylations/propoxylations per hydroxyl group.

In an embodiment, hydroxyl components are polyether polyols obtained by modifying a polyhydric alcohol containing three or more hydroxyl groups, such as trimethylolpropane, glycerol, pentaerythritol, sorbitol, sucrose, or quadrol, with a cyclic ether compound, such as ethylene oxide (EO), propylene oxide (PO), butylene oxide, or tetrahydrofuran. Specific examples include EO-modified trimethylolpropane, PO-modified trimethylolpropane, tetrahydrofuran-modified trimethylolpropane, EO-modified glycerol, PO-modified glycerol, tetrahydrofuran-modified glycerol, EO-modified pentaerythritol, PO-modified pentaerythritol, tetrahydrofuran-modified pentaerythritol, EO-modified sorbitol, PO-modified sorbitol, EO-modified sucrose, PO-modified sucrose, and EO-modified quadrol. In an embodiment, hydroxyl components are EO-modified trimethylolpropane, PO-modified trimethylolpropane, EO-modified glycerol, and/or PO-modified glycerol.

In an embodiment, the polyol is tripropylene glycol. Polyols that consist of longer chains can also be incorporated into a liquid radiation curable resin. Use of such polyols yield three-dimensional articles with similar final mechanical properties to those obtained when using tripropylene glycol as a polyol. Examples of polyols with longer chains are poly(propylene glycol) and copolymers thereof, poly(ethylene glycol) and copolymers thereof, poly(teramethylene oxide) also known as poly(tetrahydrofuran) or derivatives such as poly(2-methyltetrahydrofuran) and copolymers thereof, poly(butylene oxide) or copolymers thereof, hydroxyl-terminated poly(butadiene) and hydrogenated derivates, poly(caprolactone) diols, poly(caprolactam)diols hydroxyl-terminated poly(acrylate), hydroxyl-terminated poly(ester), poly(carbonate) telechelic diols, poly(ether) telechelic diols, poly(urethane) telechelic diols, hydroxyl-terminated poly(dimethyl siloxane) and copolymers thereof. When using a longer chain polyol, a higher wt % of polyol may be incorporated into the liquid radiation curable resin. However, such longer chain polyols have the effect of increasing the viscosity and may adversely impact the water resistance of the liquid radiation curable resin. Dendritic or hyperbranched polyols are also available, and incorporated herein, which can to a limited degree offset by morphology the undesirable increase in viscosity displayed by a comparable polymer chain of similar molecular weight.

The number average molecular weight of the polyol can be from about 100 to about 1500, or can be from about 160 to about 1000 g/mol. In an embodiment, the amount of the polyol(s) in the liquid radiation curable resin is greater than about 1 wt %, and in another embodiment greater than about 1.5 wt %. In another embodiment, the amount of the polyol(s) in the liquid radiation curable resin is less than about 10 wt %, less than about 8 wt %, or less than about 6 wt %. In an embodiment, the amount of the polyol(s) in the liquid radiation curable resin of the present invention is between about 1 and about 10 wt %, preferably between about 1 and about 8 wt %, and more preferably between about 1 and about 6 wt %. In another embodiment, the amount of the polyol(s) in the liquid radiation curable resin of the present invention is between about 1.5 and about 10 wt %, preferably between about 1.5 and about 8 wt %, and more preferably between about 1.5 and about 6 wt %.

(E) Radically Curable (Meth)Acrylate Components

Element E of the first aspect of the instant claimed invention is one or more radically curable (meth)acrylate components. The function of the radically polymerizable component in a liquid radiation curable resin is generally to develop the green strength of the cured three-dimensional article. The green strength is an important parameter in improving the process speed of a stereolithography process. It is possible to make a liquid radiation curable resin suitable for forming three-dimensional articles that contains no radically polymerizable components; however, such a liquid radiation curable resin would require substantial additional time between the curing of each layer of the liquid radiation curable resin in order to allow the cured layer to build up sufficient strength. Therefore, it is presently desirable to include radically polymerizable components in a liquid radiation curable resin in order to increase the process speed of forming a cured three-dimensional article. Suitable examples of radical polymerizable compounds are compounds having one or more ethylenically unsaturated groups, for example compounds having acrylate or methacrylate groups.

Suitable monofunctional ethylenically unsaturated compounds include isobornyloxyethyl(meth)acrylate, isobornyl(meth)acrylate, 2-ethylhexyl(meth)acrylate, ethyldiethylene glycol(meth)acrylate, lauryl(meth)acrylate, dicyclopentadiene(meth)acrylate, dicyclopentenyloxyethyl(meth)acrylate, dicyclopentenyl(meth)acrylate, 2-tetrachlorophenoxyethyl(meth)acrylate, tetrahydrofurfuryl(meth)acrylate, tetrabromophenyl(meth)acrylate, 2-tetrabromophenoxyethyl(meth)acrylate, 2-trichlorophenoxyethyl(meth)acrylate, tribromophenyl(meth)acrylate, 2-tribromophenoxyethyl(meth)acrylate, 2-hydroxyethyl(meth)acrylate, 2-hydroxypropyl(meth)acrylate, phenoxyethyl(meth)acrylate, butoxyethyl(meth)acrylate, pentachlorophenyl(meth)acrylate, pentabromophenyl(meth)acrylate, polyethylene glycol mono(meth)acrylate, polypropylene glycol mono(meth)acrylate, bornyl(meth)acrylate and, methyltriethylene diglycol(meth)acrylate.

Suitable polyfunctional radically polymerizable compounds include ethylene glycol di(meth)acrylate, dicyclopentenyl di(meth)acrylate, triethylene glycol diacrylate, tetraethylene glycol di(meth)acrylate, tricyclodecanediyldimethylene di(meth)acrylate, trimethylolpropane tri(meth)acrylate, ethylene oxide (hereinafter may be abbreviated as "EO") modified trimethylolpropane tri (meth)acrylate, propylene oxide (hereinafter may be abbreviated as "PO") modified trimethylolpropane tri(meth)acrylate, tripropylene glycol di(meth)acrylate, neopentyl glycol di(meth)acrylate, single terminal or both-terminal (meth) acrylic acid adduct of bisphenol A diglycidyl ether, 1,4-butanediol di(meth)acrylate, 1,6-hexanediol di(meth)acrylate, pentaerythritol tri(meth)acrylate, pentaerythritol tetra(meth) acrylate, polyethylene glycol di(meth)acrylate, dipentaerythritol hexa(meth)acrylate, dipentaerythritol penta(meth)acrylate, dipentaerythritol tetra(meth)acrylate, ditrimethylolpropane tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate, (meth)acrylate of phenol novolak polyglycidyl ether, and the like.

In an embodiment, radically polymerizable compounds are selected from the group consisting of bisphenol A diglycidylether diacrylate and mono-acrylate, dipentaerithritol hexacrylate and pentacrylate, trimethylolpropane triacrylate, neopentylglycol propoxylated diacrylate and isobornyl acrylate. In an embodiment the one or more radically curable (meth)acrylate components is comprised of Bisphenol A epoxy diacrylate (commercially available as CN110 from Sartomer USA, LLC).

Each of the above mentioned radically curable (meth)acrylate components can be used either individually or in combinations of two or more, or in combinations of at least one monofunctional monomer and at least one polyfunctional monomer.

In an embodiment, the content of the one or more radically curable (meth)acrylate components that may be used in the liquid radiation curable resin of the present invention is from about 2 to about 20 wt % of preferably polyfunctional acrylates, having functionality between 2 and 6. In an embodiment the content of the one or more radically curable (meth) acrylate components is greater than about 2 wt %. In another embodiment the content of the one or more radically curable (meth)acrylate components is greater than about 8 wt %. In an embodiment the content of the one or more radically curable (meth)acrylate components is less than about 20 wt %. In another embodiment the content of the one or more radically curable (meth)acrylate components is less than about 15 wt %. In an embodiment the content of the one or more radically curable (meth)acrylate components is from about 2 to about 20 wt %, preferably from about 2 to about 15 wt % relative to the total composition. In an embodiment the content of the one or more radically curable (meth)acrylate components is from about 8 to about 20 wt %, preferably from about 8 to about 15 wt % relative to the total composition.

(F) Impact Modifiers

Element F of the first aspect of the instant claimed invention is one or more impact modifiers. Examples of suitable impact modifiers are elastomers and, more preferably, prefabricated elastomer particles. These elastomers have a glass transition temperature (Tg) lower than 0° C., preferably lower than −20° C.

Particle size of the impact modifying component can be accomplished by using, for example, a dynamic light scattering nanoparticle size analysis system. An example of such a system is the LB-550 machine, available from Horiba Instruments, Inc. Information regarding multiple particle size analysis techniques can be found at http://www.horibalab.com/page.php?id=674. A preferred method of measuring particle size is laser diffraction particle size analysis in accordance with ISO13320:2009. Information regarding such analysis can be found in *Setting New Standards for Laser Diffraction Particle Size Analysis*, Alan Rawle and Paul Kippax, Laboratory Instrumentation News, Jan. 21, 2010.

In an embodiment, the liquid radiation curable resin according to the present invention contains an impact modifier in an amount greater than about 2 wt %, greater than about 7 wt %, greater than about 7.2 wt %, or greater than about 8.5 wt %. In an embodiment, the liquid radiation curable resin contains an impact modifier in an amount less than about 12 wt %, less than about 10 wt %, or less than about 9 wt %. In an embodiment, the liquid radiation curable resin contains between about 2 and about 12 wt %, more preferably between about 2 and about 10 wt %, and even more preferably from about 7 to about 9 wt % of one or more impact modifiers. In other embodiments, the liquid radiation curable resin contains an impact modifier in the amount of from about 2 to about 9 wt %, from about 7 to about 12 wt %, or from about 7 to about 10 wt %. In other embodiments, the liquid radiation curable resin contains an impact modifier in the amount of from about 7.2 to about 9 wt %, from about 7.2 to about 12 wt %, or from about 7.2 to about 10 wt %. In other embodiments, the liquid radiation curable resin contains an impact modifier in the amount of from about 8.5 to about 9 wt %, from about 8.5 to about 12 wt %, or from about 8.5 to about 10 wt %.

Monomers from a liquid radiation curable resin or solvents used in analysis can affect the measured average particle size. Dispersed average particle size refers to particles that may be swelled with monomer from a formulation or dispersion; this swelling is taken into account in the listed range. Additionally, analysis by laser diffraction may require the use of a solvent or other low viscosity dispersant. These solvents may affect measured average particle size. For the purposes of this work, dispersed average particle size refers to those particles that have been exposed to the listed monomers of a given formulation, dispersed, and then analyzed using propylene carbonate as solvent for laser diffraction particle size analysis. Dispersions of impact modifier particles were subjected to particle size analysis while in dilute propylene carbonate solution, typically used was a concentration of 0.1-0.4 g dispersion in 10 g propylene carbonate. Preparation of dispersions is described later in this specification.

The impact modifier preferably comprises elastomer particles having a dispersed average particle size between 10 nm and 1 μm. In an embodiment, the impact modifier comprises particles having a dispersed average particle size of from about 5 nm to about 850 nm. In another embodiment, the impact modifier comprises particles having a dispersed average particle size of from about 550 to about 850 nm.

Elastomers

Suitable impact modifying components, which can be dispersed into the radiation curable resin composition, are elastomers based on copolymers of ethylene or propylene and one or more $C_2$ to $C_{12}$ α-olefin monomers.

Examples of such are ethylene/propylene copolymers or ethylene/propylene copolymers, optionally containing a third copolymerizable diene monomer (EPDM), such as 1,4-hexadiene, dicyclopentadiene, di-cyclooctadiene, methylene norbornene, ethylidene norbornene and tetrahydroindene; ethylene/α-olefin copolymers, such as ethylene-octene copolymers and ethylene/α-olefin/polyene copolymers.

Other suitable elastomers are polybutadiene, polyisoprene, styrene/butadiene random copolymer, styrene/isoprene random copolymer, acrylic rubbers (e.g. polybutylacrylate), poly (hexamethylene carbonate), ethylene/acrylate random copolymers and acrylic block copolymers, styrene/butadiene/(meth)acrylate (SBM) block-copolymers, styrene/butadiene block copolymer (styrene-butadiene-styrene block copolymer (SBS), styrene-isoprene-styrene block copolymer (SIS) and their hydrogenated versions, SEBS, SEPS), and (SIS) and ionomers.

Suitable commercial elastomers are Kraton (SBS, SEBS, SIS, SEBS and SEPS) block copolymers produced by Shell, Nanostrength block copolymers E20, E40 (SBM type) and M22 (full-acrylic) as produced by Arkema, Lotryl ethyl/acrylate random copolymer (Arkema) and Surlyn ionomers (Dupont).

Optionally, the elastomer may be modified to contain reactive groups such as e.g. epoxy, oxetane, carboxyl or alcohol. This modification can e.g. be introduced by reactive grafting or by copolymerization. Commercial examples of the latter are the Lotader random ethylene/acrylate copolymers AX8840 (glycidyl methacrylate/GMA modified), AX8900 and AX8930 (GMA and maleic anhydride modified/MA) produced by Arkema.

Optionally, the elastomer may be crosslinked after mixing into the radiation curable resin composition. The crosslinking structure may be introduced via a conventional method. As examples of crosslinking agents used in such a materials peroxide, sulfur, cresol and the like, optionally in combination with multifunctional monomers like divinylbenzene, ethylene glycol di(meth)acrylate, diallylmaleate, triallylcyanurate, triallylisocyanurate, diallylphthalate, trimethylolpropane triacrylate, allyl methacrylate and the like can be given.

Pre-Fabricated Elastomer Particles

In an embodiment the impact modifiers that can be dispersed into the radiation curable resin composition are pre-fabricated elastomer particles. Elastomer particles may be prepared by a variety of means, including those obtained by isolation from latex made via emulsion polymerization, or preparation in-situ in another component of the composition. The average size of these elastomer particles is preferably between about 10 nm and about 10 μm.

Suitable commercial sources of such pre-fabricated elastomer particles are PB (polybutadiene) or PBA (polybutylacrylate) lattices available with varying average particle size from various producers, or lattices obtained by emulsification of EPDM, SBS, SIS or any other rubber.

Optionally, the elastomer may contain a crosslinking structure. The crosslinking structure may be introduced by a conventional method. As examples of crosslinking agents used in such a material peroxide, sulfur, cresol and the like, optionally in combination with multifunctional monomers like divinylbenzene, ethylene glycol di(meth)acrylate, diallylmaleate, triallylcyanurate, triallylisocyanurate, diallylphthalate, trimethylolpropane triacrylate, allyl methacrylate, and the like can be given.

Optionally, a shell may be present on the particles that can e.g. be introduced via grafting or during a second stage of emulsion polymerization. Examples of such particles are core-shell impact modifier particles that contain a rubber core and a glassy shell. Examples of core materials are polybutadiene, polyisoprene, acrylic rubber (e.g. polybutylacrylate rubber), styrene/butadiene random copolymer, styrene/isoprene random copolymer, or polysiloxane. Examples of shell materials or graft copolymers are (co)polymers of vinyl aromatic compounds (e.g. styrene) and vinyl cyanides (e.g. acrylonitrile) or (meth)acrylates (e.g. MMA).

Optionally, reactive groups can be incorporated into the shell by copolymerization, such as copolymerization with glycidyl methacrylate, or by treatment of the shell to form reactive functional groups. Suitable reactive functional groups include, but are not limited to, epoxy groups, oxetane groups, hydroxyl groups, carboxyl groups, vinyl ether groups, and/or acrylate groups.

Suitable commercially available products of these core-shell type elastomer particles are Resinous Bond RKB (dispersions of core-shell particles in epoxy manufactured by Resinous Chemical Industries Co., Ltd.), Durastrength D400, Durastrength 400R (manufactured by Arkema Group), Paraloid EXL-2300 (non-functional shell), Paraloid EXL-2314 (epoxy functional shell), Paraloid EXL-2600, Paraloid EXL-3387 and Paraloid KM-365 (manufactured by Rohm and Haas), Genioperl P53, Genioperl P23, Genioperl P22 (manufactured by Wacker Chemical), Kane Ace MX products (manufactured by Kaneka), and the like.

Other examples of such elastomer particles are crosslinked polyorganosiloxane rubbers that may include dialkylsiloxane repeating units, where "alkyl" is $C_1$-$C_6$ alkyl. Such particles may be made by the method disclosed in U.S. Pat. No. 4,853,434 to Block, incorporated in its entirety herein by reference. The particles may be modified to include reactive groups such as oxirane, glycidyl, oxetane, hydroxyl, vinyl ester, vinyl ether, or (meth)acrylate groups, or combinations thereof, preferably on the surface of the particles.

Examples of polyorganosiloxane elastomer particles that are commercially available are Albidur EP 2240(A), Albidur EP 2640, Albidur VE 3320, Albidur EP 5340, Albidur EP 5640, and Albiflex 296 (dispersions of particles in epoxy or vinyl ether resins, Hanse Chemie, Germany), Genioperl M41C (dispersion in epoxy, Wacker Chemical), Chemisnow MX Series and MP Series (Soken Chemical and Engineering Co.).

Other materials that can be used to make the core-shell particles for use in the present invention can be found in for example: Nakamura et al, J. Appl. Polym. Sci. v 33 n 3 Feb. 20, 1987 p 885-897, 1987, which discloses a core-shell material with a poly(butyl acrylate) core and poly(methyl methacrylate) shell. The shell has been treated so that it contains epoxide groups; Saija, L. M. and Uminski, M., Surface Coatings International Part B 2002 85, No. B2, June 2002, p. 149-53, which describes a core shell material with core and shell prepared from poly(methyl methacrylate-co-butyl acrylate), and treated with MMA or AMPS to produce material with carboxylic acid groups on the surface; Aerdts, A. M et al, Polymer 1997 38, No. 16, 1997, p. 4247-52, which describes a material using polystyrene, poly(methyl methacrylate) or polybutadiene as its core. An epoxidized poly(methyl methacrylate) is used for the shell. The epoxide sites are reactive sites on the shell of this material. In another embodiment, glycidyl methacrylate and methyl methacrylate are used as a co-monomer in the shell.

The core-shell particles can include more than one core and/or more than one shell. In addition, mixtures of core-shell particles with elastomer particles can be used.

In an embodiment, two different diameters of impact modifiers are used in a certain ratio. The use of two different impact modifiers with different diameters has the effect of lowering the viscosity of the liquid radiation curable resin. In an embodiment, the composition of impact modifiers is about a 7 to 1 ratio of diameter (e.g. 140 nm particles vs. a 20 nm particles) and about a 4 to 1 ratio of wt %. In another embodiment, the composition of impact modifiers is about a 5 to 1 ratio of diameter and about a 4 to 1 ratio of wt %. In another embodiment the composition of impact modifiers is about a 5 to 1 ratio of diameter and about a 6 to 1 ratio of wt %. One skilled in the art will choose an appropriate particle size based on the particle size in the dispersed phase.

(G) Free Radical Photoinitiator

Element G of the first aspect of the instant claimed invention is a free radical photoinitiator. Examples of photoinitiators include benzoins, such as benzoin, benzoin ethers, such as benzoin methyl ether, benzoin ethyl ether, and benzoin isopropyl ether, benzoin phenyl ether, and benzoin acetate, acetophenones, such as acetophenone, 2,2-dimethoxyacetophenone, 4-(phenylthio)acetophenone, and 1,1-dichloroacetophenone, benzil, benzil ketals, such as benzil dimethyl ketal, and benzil diethyl ketal, anthraquinones, such as 2-methylanthraquinone, 2-ethylanthraquinone, 2-tertbutylanthraquinone, 1-chloroanthraquinone, and 2-amylanthraquinone, also triphenylphosphine, benzoylphosphine oxides, such as, for example, 2,4,6-trimethylbenzoyldiphenylphosphine oxide (Lucirin TPO), benzophenones, such as benzophenone, dimethoxybenzophenone, diphenoxybenzophenone, and 4,4'-bis(N,N'-dimethylamino)benzophenone, thioxanthones and xanthones, acridine derivatives, phenazene derivatives, quinoxaline derivatives or 1-phenyl-1,2-propanedione-2-O-benzoyloxime, 1-aminophenyl ketones or 1-hydroxyphenyl ketones, such as 1-hydroxycyclohexyl phenyl ketone, phenyl (1-hydroxyisopropyl)ketone and 4-isopropylphenyl(1-hydroxyisopropyl)ketone, or triazine compounds, for example, 4'''-methyl thiophenyl-1-di (trichloromethyl)-3,5-S-triazine, S-triazine-2-(stilbene)-4,6-bistrichloromethyl, and paramethoxy styryl triazine, all of which are known compounds.

Especially suitable free-radical photoinitiators, which are normally used in combination with a He/Cd laser, operating at for example 325 nm, an Argon-ion laser, operating at for example 351 nm, or 351 and 364 nm, or 333, 351, and 364 nm, or a frequency tripled YAG solid state laser, having an output of 351 or 355 nm, as the radiation source, are acetophenones, such as 2,2-dialkoxybenzophenones and 1-hydroxyphenyl ketones, for example 1-hydroxycyclohexyl phenyl ketone, or 2-hydroxy-1-{4-(2-hydroxyethoxy)phenyl}-2-methyl-1-propanone, benzophenone, or 2-hydroxyisopropyl phenyl ketone (also called 2-hydroxy-2,2-dimethylacetophenone), but especially 1-hydroxycyclohexyl phenyl ketone. Another class of free-radical photoinitiators comprises the benzil ketals, such as, for example, benzil dimethyl ketal. Especially an alpha-hydroxyphenyl ketone, benzil dimethyl ketal, or 2,4,6-trimethylbenzoyldiphenylphosphine oxide may be used as photoinitiator.

Another class of suitable free radical photoinitiators comprises the ionic dye-counter ion compounds, which are capable of absorbing actinic rays and producing free radicals, which can initiate the polymerization of the (meth)acrylates. The compositions according to the invention that comprise ionic dye-counter ion compounds can thus be cured in a more variable manner using visible light in an adjustable wavelength range of 400 to 700 nanometers. Ionic dye-counter ion compounds and their mode of action are known, for example from published European patent application EP 223587 and U.S. Pat. Nos. 4,751,102, 4,772,530 and 4,772,541. There may be mentioned as examples of suitable ionic dye-counter ion compounds the anionic dye-iodonium ion complexes, the anionic dye-pyryllium ion complexes and, especially, the cationic dye-borate anion compounds of the following formula (9):

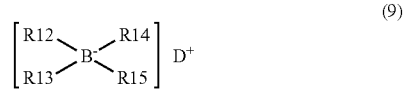

wherein $D^+$ is a cationic dye and R12, R13, R14, and R15 are each independent of the others' alkyl, aryl, alkaryl, allyl, aralkyl, alkenyl, alkynyl, an alicyclic or saturated or unsaturated heterocyclic group. In an embodiment, definitions for the radicals R12 to R15 can be found, for example, in EP 223587.

In an embodiment, free radical photoinitiators include 1-hydroxycyclohexyl phenyl ketone, 2-hydroxy-2-methyl-1-phenylpropan-1-one, 2,2-dimethoxyacetophenone, benzophenone and 2,4,6-trimethylbenzoyldiphenylphosphine oxide. These photoinitiators alone or in combination with each other tend to be comparatively less yellowing. For light sources emitting in the 300-475 nm wavelength range, especially those emitting at 365 nm, 390 nm, or 395 nm, examples of suitable free-radical photoinitiators absorbing in this area include: benzoylphosphine oxides, such as, for example, 2,4,6-trimethylbenzoyl diphenylphosphine oxide (Lucirin TPO from BASF) and 2,4,6-trimethylbenzoyl phenyl, ethoxy phosphine oxide (Lucirin TPO-L from BASF), bis(2,4,6-trimethylbenzoyl)-phenylphosphineoxide (Irgacure 819 or BAPO from Ciba), 2-methyl-1-[4-(methylthio)phenyl]-2-morpholinopropanone-1 (Irgacure 907 from Ciba), 2-benzyl-2-(dimethylamino)-1-[4-(4-morpholinyl) phenyl]-1-butanone (Irgacure 369 from Ciba), 2-dimethylamino-2-(4-methyl-benzyl)-1-(4-morpholin-4-yl-phenyl)-butan-1-one (Irgacure 379 from Ciba), 4-benzoyl-4'-methyl diphenyl sulphide (Chivacure BMS from Chitec), 4,4'-bis(diethylamino) benzophenone (Chivacure EMK from Chitec), and 4,4'-bis (N,N'-dimethylamino)benzophenone (Michler's ketone). Also suitable are mixtures thereof.

Additionally, photosensitizers are useful in conjunction with photoinitiators in effecting cure with light sources emitting in this wavelength range. Examples of suitable photosensitizers include: anthraquinones, such as 2-methylanthraquinone, 2-ethylanthraquinone, 2-tertbutylanthraquinone, 1-chloroanthraquinone, and 2-amylanthraquinone, thioxanthones and xanthones, such as isopropyl thioxanthone, 2-chlorothioxanthone, 2,4-diethylthioxanthone, and 1-chloro-4-propoxythioxanthone, methyl benzoyl formate (Darocur MBF from Ciba), methyl-2-benzoyl benzoate (Chivacure OMB from Chitec), 4-benzoyl-4'-methyl diphenyl sulphide (Chivacure BMS from Chitec), 4,4'-bis(diethylamino)benzophenone (Chivacure EMK from Chitec).

It is possible for light sources to be designed to emit light at shorter wavelengths. For light sources emitting at wavelengths from between about 100 and about 300 nm, it is desirable to employ a photosensitizer with a photoinitiator. When photosensitizers, such as those previously listed are present in the formulation, other photoinitiators absorbing at shorter wavelengths can be used. Examples of such photoinitiators include: benzophenones, such as benzophenone, 4-methyl benzophenone, 2,4,6-trimethyl benzophenone, and dimethoxybenzophenone, and, 1-hydroxyphenyl ketones, such as 1-hydroxycyclohexyl phenyl ketone, phenyl (1-hydroxyisopropyl)ketone, 2-hydroxy-1-[4-(2-hroxyethoxy) phenyl]-2-methyl-1-propanone, and 4-isopropylphenyl(1-hydroxyisopropyl)ketone, benzil dimethyl ketal, and oligo-

[2-hydroxy-2-methyl-1-[4-(1-methylvinyl)phenyl]propanone] (Esacure KIP 150 from Lamberti).

Light sources can also be designed to emit visible light. For LED light sources emitting light at wavelengths from about 475 nm to about 900 nm, examples of suitable free radical photoinitiators include: camphorquinone, 4,4'-bis(diethylamino)benzophenone (Chivacure EMK from Chitec), 4,4'-bis(N,N'-dimethylamino)benzophenone (Michler's ketone), bis(2,4,6-trimethylbenzoyl)-phenylphosphineoxide (Irgacure 819 or BAPO from Ciba), metallocenes such as bis(eta 5-2-4-cyclopentadien-1-yl)bis[2,6-difluoro-3-(1H-pyrrol-1-yl) phenyl]titanium (Irgacure 784 from Ciba), and the visible light photoinitiators from Spectra Group Limited, Inc. such as H-Nu 470, H-Nu-535, H-Nu-635, H-Nu-Blue-640, and H-Nu-Blue-660.

Suitable light sources for use with the instant claimed invention are lasers, lamps, or light-emitting diodes (LEDs).

In an embodiment, the liquid radiation curable resin comprises a free radical photoinitiator in the amount of less than about 8 wt %, and less than about 5 wt % in another embodiment, or less than about 2.7 wt %. In other embodiments, the amount of free radical photoinitiator is greater than about 0.1 wt % or greater than about 2.3 wt %. In an embodiment, the present composition comprises, relative to the total weight of the composition, between about 0.1 and about 8 wt % of radical photoinitiator, between about 0.1 and about 5 wt %, from about 0.1 to about 2.7 wt %, from about 2.3 to about 8 wt %, from about 2.3 to about 5 wt %, or from about 2.3 to about 2.7 wt % of free radical photoinitiator.

In an embodiment, the cationically polymerizable/radically polymerizable ratio ranges from 4.5 to 15, or preferably between 5 and 10, or most preferably between 5 and 9.

(H) Cationic Photoinitiators

Element H of the first aspect of the instant claimed invention is one or more cationic photoinitiators. In the compositions according to the invention, any suitable type of photoinitiator that, upon exposure to actinic radiation, forms cations that initiate the reactions of the cationically polymerizable compounds, such as epoxy material(s), can be used. There are a large number of known and technically proven cationic photoinitiators that are suitable. They include, for example, onium salts with anions of weak nucleophilicity. Examples are halonium salts, iodosyl salts or sulfonium salts, such as are described in published European patent application EP 153904 and WO 98/28663, sulfoxonium salts, such as described, for example, in published European patent applications EP 35969, 44274, 54509, and 164314, or diazonium salts, such as described, for example, in U.S. Pat. Nos. 3,708,296 and 5,002,856. All eight of these disclosures are hereby incorporated in their entirety by reference. Other cationic photoinitiators are metallocene salts, such as described, for example, in published European applications EP 94914 and 94915, which applications are both hereby incorporated in their entirety by reference.

A survey of other current onium salt initiators and/or metallocene salts can be found in "UV Curing, Science and Technology", (Editor S. P. Pappas, Technology Marketing Corp., 642 Westover Road, Stamford, Conn., U.S.A.) or "Chemistry & Technology of UV & EB Formulation for Coatings, Inks & Paints", Vol. 3, SITA Technology Ltd.: London 1992 (edited by P. K. T. Oldring), and both books are hereby incorporated in their entirety by reference.

In embodiments, initiators include triaryl sulfonium salts, diaryl iodonium salts, or the like. Typical photo-polymerization initiators are represented by the following formulae (10) and (11):

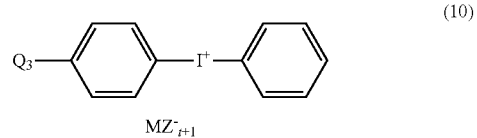

(10)

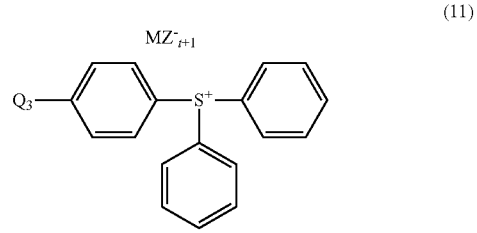

(11)

wherein $Q_3$ represents a hydrogen atom, an alkyl group having 1 to 18 carbon atoms, an alkoxyl group having 1 to 18 carbon atoms a thiophenyl group or a group represented by the formula (11a):

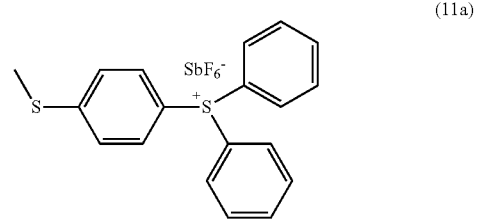

(11a)

M represents a metal atom, in an embodiment, antimony;

Z represents a halogen atom, in an embodiment, fluorine; and t is the valent number of the metal. For example, t is equal to 6 in the case of antimony.

In other embodiments cationic photoinitiators include iodonium photoinitiators, e.g. iodonium tetrakis(pentafluorophenyl) borate, because they tend to be less yellowing, especially when used in combination with photosensitizers such as, for instance, n-ethyl carbazole.

In order to increase the light efficiency or to sensitize the cationic photoinitiator to specific wavelengths, such as, for example, specific laser wavelengths or a specific series of laser wavelengths, it is also possible, depending on the type of initiator, to use sensitizers. Examples are polycyclic aromatic hydrocarbons or aromatic keto compounds. In an embodiment sensitizers are those mentioned in published European patent application EP 53904. In other embodiments sensitizers are benzoperylene, 1,8-diphenyl-1,3,5,7-octatetraene, and 1,6-diphenyl-1,3,5-hexatriene as described in U.S. Pat. No. 5,667,937, which is hereby incorporated in its entirety by reference. It will be recognized that an additional factor in the choice of sensitizer is the nature and primary wavelength of the source of actinic radiation.

In an embodiment, the present composition comprises, relative to the total weight of the composition, greater than about 0.1 wt % of cationic photoinitiator, greater than about 3.3 wt %, or greater than about 3.7 wt % in another embodiment. In another embodiment, the present invention comprises less than about 8 wt % of cationic photoinitiator or less than about 4.5 wt % of cationic photoinitiator. In an embodiment, the liquid radiation curable resin comprises from about 0.1 to about 8 wt % of cationic photoinitiator. In an embodiment, the present composition comprises, relative to the total weight of the composition, from about 0.1 to about 4.5 wt %, from about 3.3 to about 8 wt %, from about 3.3 to about 4.5 wt % of cationic photoinitiator, from about 3.7 to about 8 wt % of cationic photoinitiator, or from about 3.7 to about 4.5 wt % of cationic photoinitiator.

Other Cationically Polymerizable Components

Other cationically polymerizable components that may be used in the composition of the present invention include, for instance, cyclic lactone compounds, cyclic acetal compounds, cyclic thioether compounds, spiro orthoester compounds, and vinylether compounds.

It is of course possible to use mixtures of cationically polymerizable components in the compositions according to the invention.

Cationically Polymerizable/Hydroxy Ratio

In an embodiment, the composition of the present invention has a cationically polymerizable/hydroxy ratio between 2.0 and 5.0. The cationically polymerizable/hydroxy ratio (Cat. Poly./Hydroxy) is the amount of cationically polymerizable functional groups divided by the amount of hydroxy functional groups present in the composition. The amount of cationically polymerizable groups is calculated by determining the number (mmol) of cationically polymerizable groups present in 100 grams of the composition. Cationically polymerizable groups include epoxy, oxetane, tetrahydrofuran, cyclic lactone, cyclic acetal, cyclic thioether, Spiro orthoester, and vinylether groups. The amount of hydroxy groups (or hydroxy value) is calculated by determining the number (mmol) of hydroxy groups present in 100 grams of the composition. Only primary hydroxyl groups present in the cationically polymerizable elements (elements A, B, C) and the polyol element (D) of the instant claimed invention are taken into account in calculating the hydroxy value. Other components may also contain hydroxy groups (for example some (meth)acrylate compounds and radical photoinitiators), but they are not expected to have a strong chain transfer effect on the cationic polymerization and are for this reason and for reasons of simplicity kept out of the calculation.

Generally, a higher cationically polymerizable/hydroxy ratio in the liquid radiation curable resin leads to a three-dimensional articles with a higher modulus and higher $T_g$. However, a lower cationically polymerizable/hydroxy ratio generally leads to a more ductile matrix and, consequently, better impact resistance. Therefore, the cationically polymerizable/hydroxy ratio must be finely balanced in order to achieve a liquid radiation curable resin capable of producing three-dimensional articles with high modulus, $T_g$, and impact resistance.

In case the cationically polymerizable groups are epoxy groups, one may also describe the cationically polymerizable/hydroxy ratio as the epoxy/hydroxy ratio.

The cationically polymerizable/hydroxy ratio preferably ranges from about 2.0 to about 4.0, and more preferably from about 2.1 to about 3.5.

Components with Both Cationically Polymerizable and Radically Polymerizable Groups The composition of the invention may also contain molecules which have more than one type of reactive functional groups, such that one type of functional group is capable of cationic homopolymerization while a second type of functional group on the same molecule is capable of radical polymerization. Addition of these compounds to the composition of the present invention gives the unexpected effect of increased strength of the green part and improved elongation to break. Cationically polymerizable groups include epoxy, oxetane, tetrahydrofuran, cyclic lactone, cyclic acetal, cyclic thioether, Spiro orthoester, and vinylether groups. Hydroxy groups, which can participate in cationic polymerization as chain transfer agents, are not included as cationically polymerizable groups since the hydroxyl groups can not be homopolymerized under cationic conditions. Radically polymerizable groups include (meth)acrylates, vinyl groups, and vinylidene groups.

Commercially available materials having cationically polymerizable and free-radically polymerizable functional groups include the "Cyclomer" series, such as Cyclomer M-100, M-101, or A-200 (available from Daicel Chemical, Japan), Ebecryl-3605 (available from Cytec Industries), VEEA or VEEM (available from Nippon Shobukai Co. Ltd. of Osaka, Japan), and CD611, SR531 or SR285 (available from Sartomer).

Components with both cationically polymerizable and radically polymerizable groups are generally present in an amount from about 0 to about 25 wt %, preferably between about 1 and about 20 wt %, more preferably in a range between about 3 and about 15 wt %. The above compounds having both cationically polymerizable and radically polymerizable groups are included in the calculation of the cationically polymerizable/hydroxy ratio and the cationically polymerizable/radically polymerizable ratio.

Additives/Other Components

Additives may also be present in the composition of the invention. Stabilizers are often added to the compositions in order to prevent a viscosity build-up, for instance a viscosity build-up during usage in a solid imaging process. In an embodiment, stabilizers include those described in U.S. Pat. No. 5,665,792, the entire disclosure of which is hereby incorporated by reference. Such stabilizers are usually hydrocarbon carboxylic acid salts of group IA and IIA metals. In embodiments, these salts are sodium bicarbonate, potassium bicarbonate, and rubidium carbonate. Alternative stabilizers are polyvinylpyrrolidones and polyacrylonitriles. Other possible additives/other components include dyes, pigments, fillers (e.g. silica particles—in embodiments, cylindrical or spherical silica particles-, talc, glass powder, alumina, alumina hydrate, magnesium oxide, magnesium hydroxide, barium sulfate, calcium sulfate, calcium carbonate, magnesium carbonate, silicate mineral, diatomaceous earth, silica sand, silica powder, titanium oxide, aluminum powder, bronze powder, zinc powder, copper powder, lead powder, gold powder, silver dust, glass fiber, titanic acid potassium whisker, carbon whisker, sapphire whisker, beryllia whisker, boron carbide whisker, silicon carbide whisker, silicon nitride whisker, glass beads, hollow glass beads, metaloxides and potassium titanate whisker), antioxidants, wetting agents, photosensitizers for the free-radical photoinitiator, free-radical chain transfer agents, leveling agents, defoamers, surfactants and the like. BYK (antifoam solution, in an embodiment, BYK A 501 available from BYK Chemie) and polyalkyleneoxide modified polydimethylsiloxane (a wetting agent commercially available as Silwet 7600 from GE Silicones—OSI Specialties) were also used as additives in the composition of the present invention.

Functional Properties

The selection of the components of the liquid radiation curable resin is critical to achieving a desired combination of physical properties. Therefore, the liquid radiation curable resin has a viscosity at 30° C. below about 1300 cps. This allows the preparation of a cured three-dimensional article via a modern stereolithography process that, after full cure, has a modulus of greater than about 2 GPa, a notched Izod impact strength of greater than about 0.30 J/cm, a heat deflection temperature of greater than about 40° C., and a 24-hour water uptake of less than 0.70% weight gain in combination is not known. The selection of the components of the liquid radiation curable resin is critical to achieving this desired combination of physical properties. If each component is not present in the appropriate amount, it is not possible to achieve the desired combination of physical properties. The measurement of each functional property is explained in the Examples section below.

The functional properties of the cured three-dimensional article made via a stereolithography process by curing the liquid radiation curable resin of the instant claimed invention are present in the cured three-dimensional article after full cure. Full cure describes the ultimate solidified state of a cured monomer-to-polymer system. For stereolithography compositions, the term "full cure" refers specifically to the extent of monomer to polymer conversion achieved after 1) determining the photospeed of a particular liquid radiation curable resin, 2) fabricating a part under the conditions prescribed by the photospeed experiment, and 3) cleaning and UV postcuring the part in a controlled manner. More information on the UV postcuring can be found in the Examples section, below. For the purposes of standardized analysis, full cure may also be achieved by a conditioning period in controlled temperature and humidity conditions (e.g. 7 days at 23° C./50% Relative Humidity). Subsequent cure may take place over extended time periods (e.g. embrittlement in epoxy systems) but it is not considered for these purposes. All mechanical properties are measured at room temperature (approximately 20-25° C.), unless otherwise noted.

In an embodiment, the liquid radiation curable resin has a viscosity at 30° C. of less than about 1300 cps, more preferably less than about 1250 cps. In embodiments, the liquid radiation curable resin has a viscosity at 30° C. of more than about 200 cps, more than about 300 cps, or more than about 600 cps. In another embodiment, the liquid radiation curable resin has a viscosity at 30° C. of between about 600 cps and about 1300 cps, more preferably between about 600 cps and about 1250 cps. In another embodiment, the liquid radiation curable resin has a viscosity at 30° C. of between about 200 cps and about 1300 cps, more preferably between about 200 cps and about 1250 cps. In another embodiment, the liquid radiation curable resin has a viscosity at 30° C. of between about 300 cps and about 1300 cps, more preferably between about 300 cps and about 1250 cps.

In another embodiment, the liquid radiation curable resin is capable of curing into a cured three-dimensional article that, after full cure, has a Young's modulus of greater than about 2 GPa. In another embodiment, the cured three-dimensional article has a modulus of greater than about 2.25 GPa. In embodiments, the cured three-dimensional article has a modulus of less than about 2.25 GPa, less than about 2.80 GPa, or less than about 3 GPa. In another embodiment, the cured three-dimensional article has a modulus of between about 2 GPa and about 3 GPa. In a further embodiment, the cured three-dimensional article has a modulus between about 2 GPa and about 2.80 GPa. In another embodiment, the cured three-dimensional article has a modulus between about 2.25 GPa and about 3 GPa. In a further embodiment, the cured three-dimensional article has a modulus of between about 2.25 GPa and about 2.80 GPa.

In an embodiment, the liquid radiation curable resin is capable of curing into a cured three-dimensional article that, after full cure, has a notched Izod impact strength of greater than about 0.30 J/cm. In embodiments, the cured three-dimensional article has a notched Izod impact strength of less than about 0.60 J/cm, less than about 0.55 J/cm, or less than about 0.53 J/cm. In another embodiment, the cured three-dimensional article has a notched Izod impact strength of between about 0.30 J/cm and about 0.60 J/cm. In another embodiment, the cured three-dimensional article has a notched Izod impact strength of between about 0.30 and about 0.55 J/cm. In another embodiment, the cured three-dimensional article has a notched Izod impact strength of between about 0.30 and about 0.53 J/cm. In a further embodiment, the cured three-dimensional article has a notched Izod impact strength of between about 0.30 J/cm and about 0.36 J/cm when cured on a SSI machine. In a further embodiment, the cured three-dimensional article has a notched Izod impact strength of between about 0.30 J/cm and about 0.60 J/cm when cured on a Viper machine. In another embodiment, the cured three-dimensional article has a notched Izod impact strength of between about 0.30 J/cm and about 0.55 J/cm when cured on a Viper machine. In another embodiment, the cured three-dimensional article has a notched Izod impact strength of between about 0.30 J/cm and about 0.53 J/cm when cured on a Viper machine.

In an embodiment, the liquid radiation curable resin is capable of curing into a cured three-dimensional article that, after full cure, has a heat deflection temperature at 0.45 MPa load of greater than about 40° C. In another embodiment, the cured three-dimensional article has a heat deflection temperature of greater than about 45° C. In another embodiment, the cured three-dimensional article has a heat deflection temperature of greater than about 50° C. In another embodiment, the cured three-dimensional article has a heat deflection temperature of greater than about 55° C. In another embodiment, the cured three-dimensional article has a heat deflection temperature of less than about 55° C. In another embodiment, the cured three-dimensional article has a heat deflection temperature of less than about 60° C. In another embodiment, the cured three-dimensional article has a heat deflection temperature of less than about 65° C. In a further embodiment, the cured three-dimensional article has a heat deflection temperature of between about 40° C. and about 65° C. In another embodiment, the cured three-dimensional article has a heat deflection temperature of between about 45° C. and about 65° C. In another embodiment, the cured three-dimensional article has a heat deflection temperature of between about 50° C. and about 65° C. In a further embodiment, the cured three-dimensional article has a heat deflection temperature of between about 55° C. and about 65° C. In a further embodiment, the cured three-dimensional article has a heat deflection temperature of between about 40° C. and about 55° C. In another embodiment, the cured three-dimensional article has a heat deflection temperature of between about 45° C. and about 55° C. In another embodiment, the cured three-dimensional article has a heat deflection temperature of between about 50° C. and about 55° C. In a further embodiment, the cured three-dimensional article has a heat deflection temperature of between about 40° C. and about 60° C. In another embodiment, the cured three-dimensional article has a heat deflection temperature of between about 45° C. and about 60° C. In another embodiment, the cured three-dimensional article has a heat deflection temperature of between about 50° C. and about 60° C., and in a further embodiment between about 55° C. and about 60° C.

In an embodiment, the liquid radiation curable resin is capable of curing into a cured three-dimensional article that, after full cure, has a water uptake after 24-hours immersion in water of less than about 0.70% weight gain. In another embodiment, the cured three-dimensional article has a 24-hour water absorption value of less than 0.61% weight gain. In another embodiment, the cured three-dimensional article has a 24-hour water absorption value of greater than about 0.2% weight gain. In another embodiment, the cured three-dimensional article has a 24-hour water absorption value of greater than about 0.35% weight gain. In another embodiment, the cured three-dimensional article has a 24-hour water uptake of between about 0.2 weight % and about 0.7 weight %. In a further embodiment, the cured three-dimensional article has a 24-hour water uptake of between about 0.2 weight % and about 0.61 weight %. In another embodiment, the cured three-dimensional article has a 24-hour water uptake of between about 0.35 weight % and about 0.7 weight %. In a further embodiment, the cured three-dimensional article has a 24-hour water uptake of between about 0.35 weight % and about 0.61 weight %.

In an embodiment, the liquid radiation curable resin is capable of curing into a three-dimensional article that, after full cure, has a strain softening value of greater than about 20% of yield stress. In another embodiment, the cured three-dimensional article has a strain softening value of greater than about 25% of yield stress. In a further embodiment, the cured three-dimensional article has a strain softening value of less than about 30% of yield stress, and in another embodiment less than about 25% of yield stress. In another embodiment the cured three-dimensional article has a strain softening value of from about 20% to about 30% of yield stress. In another embodiment, the cured three-dimensional article has a strain softening value of from about 25% to about 30% of yield stress.

It should be understood that in an embodiment the liquid radiation curable resin of the instant claimed invention or a three-dimensional articles made therefrom, as appropriate, should be capable of attaining a suitable viscosity, modulus, notched Izod impact strength, heat deflection temperature, and 24-hour water uptake value in combination. Therefore, in an embodiment a liquid radiation curable resin of the instant claimed invention should have a viscosity at 30° C. of less than about 1300 cps, and a cured three-dimensional article made from the liquid radiation curable resin, after full cure, should have a modulus of greater than about 2 GPa, a notched Izod impact strength of greater than about 0.30 J/cm, a heat deflection temperature of greater than about 40° C., and a 24-hour water uptake of less than 0.70% weight gain, along with any combination of the intermediate ranges described in the previous five paragraphs.

Crosslink Density

The three-dimensional articles made with the preferred compositions preferably have a medium crosslink density. It has been found that having a high crosslink density makes the composition brittle. A measure for the crosslink density can be conveniently determined by examining the value of the DMA storage modulus E' at 200° C., as measured with dynamic mechanical analysis in tension with a frequency of 1 Hz. Preferably, the storage modulus E' at 200° C. ranges between 2 and 35 MPa, more preferably between 4 and 30 MPa, more preferably between 6 and 25 MPa and most preferred between 8 and 20 MPa. DMA storage modulus E' is also known as equilibrium modulus.

SPECIFIC EMBODIMENTS

The instant claimed invention will now be described with respect to several embodiments. The specific ingredients mentioned in these embodiments are described in detail in Table 1, below.

TABLE 1

| Material Name | Material Description | Vendor |
|---|---|---|
| Cyracure UVR-6105 | 3,4-Epoxy Cyclohexyl Methyl-3,4-Epoxy Cyclohexyl Carboxylate | Dow Chemical |
| UVR 6128 | Bis((3,4-epoxycyclohexyl)methyl)adipate | Dow Chemical |
| Ebecryl 3605 | Partially acrylated Bisphenol-A epoxy resin | Cytec |
| Epon 825 | Bisphenol A Diglycidyl Ether Epoxy Resin | Hexion |
| Epon 828 | Bisphenol A Diglycidyl Ether Epoxy Resin | Hexion |
| Epikote 806 | Bisphenol F Diglycidyl Ether | Japan Epoxy Resins Co. |
| Epalloy 5000 | Diglycidyl ether of Hydrogenated Bisphenol-A | CVC Chemical |
| Epikote 834 | Hi MW Bisphenol A Diglycidyl Ether | Japan Epoxy Resins Co. |
| OXT 101 | 3-Ethyl-3-hydroxymethyl-oxetane | Toagosei |
| OXT 221 | Bis{([1-ethyl(3-oxetanyl)]methyl)ether | Toagosei |
| OXT 212 | 3-Ethyl-3-[(2-ethylhexyloxy)methyl]oxetane | Toagosei |
| DCE 410 | 7-Oxabicyclo[4.1.0]heptane 3-carboxylic acid, 2-ethylhexyl ester | Dixie Chemical |
| Stepanpol PS2002 | Di(diethylene glycol) o-phthalate oligoester diol | Stepan Company |
| SynFac 8025U | Polyalkoxylated Bisphenol A | Milliken Chemical |
| Triethylene Glycol | Triethylene Glycol | Aldrich |
| Tropropylene Glycol | Tropropylene Glycol | Aldrich |
| PTMG 650 | Poly(oxytetramethylene)glycol | Lyondell |
| SR 399 | Dipentaerythritol Pentaacrylate Esters | Sartomer |
| CN 110 | Bisphenol-A Epoxy Diacrylate | Sartomer |
| Ebecryl 3700 | Bisphenol-A epoxy diacrylate | Cytec |
| Aronix M-315 | EO-modified isocyanurate diacrylate and triacrylate | Toagosei |
| SR 351 | Trimethylol Propane Triacrylate | Sartomer |
| Irgacure 184 | 1-Hydroxycyclohexyl phenyl ketone | Ciba Additives |
| Chivacure 1176 | Arylsulfonium Hexafluoroantimonate | Chitec |
| Paraloid EXL-2314 | Acrylic core-shell polymer | Rohm and Haas |
| MX-153 | Core-shell rubber in unmodified, liquid epoxy resin based on bisphenol-A | Kaneka |
| Irganox 1035 | Thiodiethylene bis(3,5-ditert butyl-4-hydroxyhydrocinnamate) | Ciba |
| BYK 348 | Polyether modifed siloxane (silicone surfactant) | BYK Chemie |
| Silwet L7600 | Polyalkyleneoxide modified polydimethylsiloxane | Momentive - GE Silicones |
| BYK A 501 | Antifoam solution, silicone free | BYK Chemie |
| V818 | Colorant | DSM Desotech |

In an embodiment, a liquid radiation curable resin comprises from about 0 to about 12 wt % of a cycloaliphatic epoxide having a linking ester group; from about 30 to about 65 wt % of one or more epoxy functional components other than A; from about 10 to about 30 wt % of one or more oxetanes; from about 1 to about 10 wt % of one or more polyols; from about 2 to about 20 wt % of one or more radically curable (meth)acrylate components; from about 2 to about 12 wt % of one or more impact modifiers; from about 0.1 to about 8 wt % of one or more free radical photoinitiators; and from about 0.1 to about 8 wt % of one or more cationic photoinitiators.

In a further embodiment, a liquid radiation curable resin comprises from about 5 to about 10 wt % of a cycloaliphatic epoxide having a linking ester group; from about 35 to about 45 wt % of one or more epoxy functional components other than A; from about 15 to about 30 wt % of one or more oxetanes; from about 1 to about 8 wt % of one or more polyols; from about 2 to about 20 wt % of one or more radically curable (meth)acrylate components; from about 2 to about 10 wt % of one or more impact modifiers; from about 0.1 to about 5 wt % of one or more free radical photoinitiators; and from about 0.1 to about 8 wt % of one or more cationic photoinitiators.

In an embodiment, the liquid radiation curable resin comprises from about 7.3 to about 8.6 wt % of a cycloaliphatic epoxide having a linking ester group (e.g. UVR-6105), from about 0 to about 2 wt % of a partially acrylated bisphenol-A epoxy resin (e.g. Ebercryl 3605), from about 20.0 to about 25.5 wt % of a bisphenol A diglycidyl ether epoxy resin (e.g. Epon 828), from about 12.8 to about 16 wt % of a diglycidyl ether of hydrogenated bisphenol A (e.g. Epalloy 5000), from about 10.3 to about 18 wt % of a mono-functional oxetane (e.g. OXT-101), from about 6.9 to about to about 11 wt % of a di-functional oxetane (e.g. OXT-221), from about 0 to about 5 wt % of a mono-functional oxetane with an ethylhexyl chain (e.g. OXT-212), from about 1.90 to about 5.25 wt % of tripropylene glycol, from about 8 to about 14.6 wt % of acrylate functional components (e.g. some combination of e.g. CN 110, Ebecryl 3700, and/or SR351), from about 2.3 to about 2.7 wt % of free radical photoinitiator (e.g. Irgacure 184), from about 3.3 to about 4.5 wt % of cationic photoinitiator (e.g. Chivacure 1176), from about 8.5 to about 9.0 wt % of impact modifier (e.g. Paraloid EXL-2314), and from about 0 to about 0.22 wt % of surfactants (e.g. Silwet 7600, BYK A-501, BYK 348).

In an embodiment, the liquid radiation curable resin comprises from about 8.7 to about 9.2 wt % of a cycloaliphatic epoxide having a linking ester group (e.g. UVR-6105), from about 26 to about 26.6 wt % of a bisphenol A diglycidyl ether epoxy resin (e.g. Epon 828), from about 13.1 to about 14.3 wt % of a diglycidyl ether of hydrogenated bisphenol A (e.g. Epalloy 5000), from about 10.5 to about 17.8 wt % of a mono-functional oxetane (e.g. OXT-101), from about 0 to about to about 7 wt % of a di-functional oxetane (e.g. OXT-221), from about 0.75 to about 0.80 wt % of a mono-functional epoxide with an ethylhexyl chain (e.g. DCE 410), from about 5.1 to about 5.3 wt % of tripropylene glycol, from about 2.0 to about 2.1 wt % of pentacrylate (e.g. SR 399), from about 10.45 to about 10.70 wt % of a bisphenol A epoxy diacrylate (e.g. CN 110) or from about 10.45 to about 10.7 wt % of an EO-modified isocyanurate diacrylate and triacrylate (e.g. Aronix M-315), from about 2.3 to about 2.6 wt % of free radical photoinitiator (e.g. Irgacure 184), from about 3.7 to about 4.4 wt % of cationic photoinitiator (e.g. Chivacure 1176), from about 7.2 to about 9.0 wt % of impact modifier (e.g. Paraloid EXL-2314), from about 0 to about 0.1 wt % of an antioxidant (e.g. Irganox 1035), and from about 0 to about 0.22 wt % of surfactants (e.g. Silwet 7600, BYK A-501, BYK 348).

In another embodiment, the liquid radiation curable resin comprises about 9.7 wt % of a cycloaliphatic epoxide having a linking ester group (e.g. UVR-6105), about 28 wt % of a bisphenol A diglycidyl ether epoxy resin (e.g. Epon 828), about 15.1 wt % of a diglycidyl ether of hydrogenated bisphenol A (e.g. Epalloy 5000), about 18.7 wt % of a mono-functional oxetane (e.g. OXT-101), about 0.8 wt % of a mono-functional epoxide with an ethylhexyl chain (e.g. DCE 410), about 5.4 wt % of tripropylene glycol, about 2.1 wt % of pentacrylate (e.g. SR 399), about 11.3 wt % of a bisphenol A epoxy diacrylate (e.g. CN 110), about 2.4 wt % of free radical photoinitiator (e.g. Irgacure 184), about 3.8 wt % of cationic photoinitiator (e.g. Chivacure 1176), about 2.2 wt % of impact modifier (e.g. Paraloid EXL-2314), about 0.1 wt % of an antioxidant (e.g. Irganox 1035), about 0.20 wt % of surfactant (e.g. BYK 348), and about 0.05 wt % of a colorant (e.g. V818).

In a further embodiment, the liquid radiation curable resin comprises about 8.6 wt % of a cycloaliphatic epoxide having a linking ester group (e.g. UVR-6105), about 25.5 wt % of a bisphenol A diglycidyl ether epoxy resin (e.g. Epon 828), about 12.8 wt % of a diglycidyl ether of hydrogenated bisphenol A (e.g. Epalloy 5000), about 10.3 wt % of a mono-functional oxetane (e.g. OXT-101), about 6.9 wt % of a di-functional oxetane (e.g. OXT-221), about 0.75 wt % of a mono-functional oxetane with an ethylhexyl chain (e.g. OXT-212), about 5.2 wt % of tripropylene glycol, about 10.3 wt % of a bisphenol A epoxy diacrylate (e.g. CN 110), about 4.3 wt % of a triacrylate (e.g. SR 351), about 2.6 wt % of free radical photoinitiator (e.g. Irgacure 184), about 4.3 wt % of cationic photoinitiator (e.g. Chivacure 1176), about 8.5 wt % of impact modifier (e.g. Paraloid EXL-2314), and 0.22 wt % of surfactants (e.g. Silwet 7600, BYK A-501, BYK 348).

In an embodiment, the liquid radiation curable resin comprises about 7 wt % of a cycloaliphatic epoxide having a linking ester group (e.g. UVR-6105), about 2 wt % of a partially acrylated bisphenol-A epoxy resin (e.g. Ebercryl 3605), about 20 wt % of a bisphenol A diglycidyl ether epoxy resin (e.g. Epon 828), about 16 wt % of a diglycidyl ether of hydrogenated bisphenol A (e.g. Epalloy 5000), about 18 wt % of a mono-functional oxetane (e.g. OXT-101), about 11 wt % of a di-functional oxetane (e.g. OXT-221), about 3.2 wt % of tripropylene glycol, about 6 wt % of bisphenol A epoxy diacrylate (e.g. Ebecryl 3700), about 2 wt % of a triacrylate (e.g. SR 351), about 2.3 wt % of free radical photoinitiator (e.g. Irgacure 184), about 3.3 wt % of cationic photoinitiator (e.g. Chivacure 1176), about 9 wt % of impact modifier (e.g. Paraloid EXL-2314), and 0.2 wt % of surfactants (e.g. Silwet 7600, BYK A-501, BYK 348).

In an embodiment, the liquid radiation curable resin comprises about 7.5 wt % of a cycloaliphatic epoxide having a linking ester group (e.g. UVR-6105), about 1.9 wt % of a partially acrylated bisphenol-A epoxy resin (e.g. Ebercryl 3605), from about 20.8 to about 21.6 wt % of a bisphenol A diglycidyl ether epoxy resin (e.g. Epon 828), from about 13 to about 13.5 wt % of a diglycidyl ether of hydrogenated bisphenol A (e.g. Epalloy 5000), from about 14.3 to about 14.6 wt % of a mono-functional oxetane (e.g. OXT-101), from about 6.9 to about 7.1 wt % of a di-functional oxetane (e.g. OXT-221), from about 1 to about 5 wt % and preferably about 1, about 3, or about 5 wt % of a mono-functional oxetane with an ethylhexyl chain (e.g. OXT-212), about 2 wt % of tripropylene glycol, from about 9.5 to about 9.9 wt % of bisphenol A epoxy diacrylate (e.g. Ebecryl 3700), from about 3.8 to about 4 wt % of a triacrylate (e.g. SR 351), from about 2.6 to about 2.7 wt % of free radical photoinitiator (e.g. Irgacure 184), from about 4.3 to about 4.5 wt % of cationic photoinitiator (e.g. Chivacure 1176), and from about 8.6 to about 8.9 wt % of impact modifier (e.g. Paraloid EXL-2314).

In a further embodiment, the liquid radiation curable resin comprises about 9.2 wt % of a cycloaliphatic epoxide having a linking ester group (e.g. UVR-6105), about 26.6 wt % of a bisphenol A diglycidyl ether epoxy resin (e.g. Epon 828), about 14.3 wt % of a diglycidyl ether of hydrogenated bisphenol A (e.g. Epalloy 5000), about 17.8 wt % of a mono-functional oxetane (e.g. OXT-101), about 0.80 wt % of a mono-functional epoxide with an ethylhexyl chain (e.g. DCE 410), about 5.1 wt % of tripropylene glycol, about 2.1 wt % of pentacrylate (e.g. SR 399), about 10.70 wt % of a bisphenol A epoxy diacrylate (e.g. CN 110), about 2.3 wt % of free radical photoinitiator (e.g. Irgacure 184), about 3.7 wt % of cationic photoinitiator (e.g. Chivacure 1176), about 7.2 wt % of impact modifier (e.g. Paraloid EXL-2314), about 0.1 wt % of an antioxidant (e.g. Irganox 1035), and about 0.20 wt % of surfactant (e.g. BYK 348).

In an embodiment, the liquid radiation curable resin comprises about 8.7 wt % of a cycloaliphatic epoxide having a linking ester group (e.g. UVR-6105), about 26 wt % of a bisphenol A diglycidyl ether epoxy resin (e.g. Epon 828), about 13.1 wt % of a diglycidyl ether of hydrogenated bisphenol A (e.g. Epalloy 5000), about 10.5 wt % of a mono-functional oxetane (e.g. OXT-101), about 7 wt % of a di-functional oxetane (e.g. OXT-221), about 0.76 wt % of a mono-functional epoxide with an ethylhexyl chain (e.g. DCE 410), about 5.3 wt % of tripropylene glycol, about 2.0 wt % of pentacrylate (e.g. SR 399), about 10.5 wt % of an EO-modified isocyanurate diacrylate and triacrylate (e.g. Aronix M-315), about 2.6 wt % of free radical photoinitiator (e.g. Irgacure 184), about 4.4 wt % of cationic photoinitiator (e.g. Chivacure 1176), and about 9.0 wt % of impact modifier (e.g. Paraloid EXL-2314).

The second aspect of the instant claimed invention is a process for making a three-dimensional article comprising the steps of
  providing a liquid radiation curable resin;
  (2) providing a stereolithography machine;
  (3) coating a layer of a liquid radiation curable resin onto a surface;
  (4) exposing said layer imagewise to actinic radiation to form a first exposed imaged cross-section, wherein the radiation is of sufficient intensity and time to cause substantial curing of the layer in the exposed areas;
  (5) coating an additional layer of the liquid radiation curable resin onto the previously exposed imaged cross-section;
  (6) exposing said additional layer imagewise to actinic radiation to form an additional imaged cross-section, wherein the radiation is of sufficient intensity and time to cause substantial curing of the second layer in the exposed areas and to cause adhesion to the previously exposed imaged cross-section; and
  (7) repeating steps (5) and (6) a desired number of times to build up the three-dimensional article,
  wherein the liquid radiation curable resin is that resin of the first aspect of the instant claimed invention.

The present liquid radiation curable resins are suitable for a wide variety of applications. For instance, the liquid radiation curable resins can be used to prepare a three-dimensional object via a rapid prototyping process. Rapid prototyping, sometimes also referred to as "solid imaging" or "stereolithography", as previously described herein, is a process wherein a liquid radiation curable resin composition is coated as a layer upon a surface and exposed imagewise to actinic radiation such that the composition solidifies imagewise. This coating is most conveniently done if the composition is a liquid at room temperature. However, a solid composition may also be melted to form a layer or a solid or paste composition may be coated if it shows shear thinning behavior. Subsequently, new thin layers of photoformable composition are coated onto previous layers of exposed and unexposed composition. Then the new layer is exposed imagewise in order to solidify portions imagewise and in order to induce adhesion between portions of the new hardened region and portions of the previously hardened region. Each imagewise exposure is of a shape that relates to a pertinent cross-section of a photohardened object such that when all the layers have been coated and all the exposures have been completed, an integral photohardened object can be removed from the surrounding composition. Accordingly, a rapid prototyping process can for instance be described as:
  (1) providing a liquid radiation curable resin;
  (2) providing a stereolithography machine;
  (3) coating a layer of a liquid radiation curable resin onto a surface;
  (4) exposing said layer imagewise to actinic radiation to form a first exposed imaged cross-section, wherein the radiation is of sufficient intensity and time to cause substantial curing of the layer in the exposed areas;
  (5) coating an additional layer of the liquid radiation curable resin onto the previously exposed imaged cross-section;
  (6) exposing said additional layer imagewise to actinic radiation to form an additional imaged cross-section, wherein the radiation is of sufficient intensity and time to cause substantial curing of the second layer in the exposed areas and to cause adhesion to the previously exposed imaged cross-section; and
  (7) repeating steps (5) and (6) a desired number of times to build up the three-dimensional article,
  wherein the liquid radiation curable resin is that resin of the first aspect of the instant claimed invention.

In general, the three-dimensional article formed by exposure to actinic radiation, as discussed above, is not fully cured, by which is meant that not all of the reactive material in the composition has reacted. Uncured liquid photopolymer must be removed from the surface of the finished part, usually accomplished by solvent rinsing. The part surface is then left as a partially cured polymer surface requiring postcure. Therefore, there is often an additional step of more fully curing the article. This can be accomplished by further irradiating with actinic radiation, heating, or both. Exposure to actinic radiation can be accomplished with any convenient radiation source, generally UV radiation, for a time ranging from about 10 to over 60 minutes. Heating is generally carried out at a temperature in the range of about 75-150° C., for a time ranging from about 10 to over 60 minutes For the present invention postcuring is performed during 30-40 minutes exposure in a UV-postcure apparatus without additional heating, to obtain a fully cured article, unless otherwise specified. More information regarding the appropriate postcuring technique can be found in the Examples section, below.

The third aspect of the instant claimed invention is a three-dimensional article made via a stereolithography process that, after full cure, has a Young's modulus of from about 2 GPa to about 3 GPa, a notched hod impact strength of from about 0.30 J/cm to about 0.60 J/cm, a heat deflection temperature from about 40° C. to about 65° C., and a 24-hour water absorption value from about 0.2 weight % to about 0.7 weight %.

The following examples further illustrate the invention but, of course, should not be construed as in any way limiting its scope.

EXAMPLES

Preparation of Dispersions

Core-shell powders are added to epoxy resin with gentle stirring and mixed until the powders are wetted. The slurry is transferred to the mix can of a three-shaft Versamixer manufactured by Charles Ross & Sons. The slurry is mixed at 60 rpm with the anchor mixer, while the water jacket is heated with hot water. When the slurry temperature reaches 35° C., the disperser speed is set to 5000 rpm and the water flow to the water jacket is stopped. When the slurry temperature rises to 45° C., the disperser speed is raised to 6500 rpm and the emulsifier speed is set at 5500 rpm. The mix can is evacuated to a vacuum of 948 mbar once the temperature reaches 60° C. When the temperature reaches 80-82° C., the disperser and emulsifier are turned off and the mixture is cooled by flowing cold water through the water-jacket. Once the temperature falls below 50° C., the anchor agitator is turned off and air is re-admitted to the mix can. Alternatively, dispersions can be prepared by high-shear mixing using a Hockmeyer mixer fitted with an E-style, F-style, or G-style high-shear blade operating at 500-2000 rpm for a period of 0.5-4 hours.

Preparation of Formulations

The individual components are weighed out and added into a suitable container. Several components (the core-shell/epoxy dispersions, Ebecryl 3605, and Stepanpol) are warmed to 55° C. before being weighed out and blended. Mixing is accomplished over 6-16 hours at ambient temperature using a propeller type mixing blade. Formulations are degassed by conditioning in a Stereolithography machine chamber at 30 C for a period of 12-24 hours.

Working Curve Measurement

The working curve is a measure of the photospeed of the particular material. It represents the relationship between the thickness of a floating layer, scanned on the surface of the photopolymer in a vat or petri dish, produced as a function of the exposure given. For all formulations, the exposure-working curve of the formula is determined using methods well known in the art.

The exposure response for each formulation is measured using a 20 g sample of the formulation in a 100 mm diameter petri dish held at 30° C. and 30% RH. The surface of the formulation is exposed with a beam from a laser; either an argon-ion laser operating with the wavelengths of 333, 351, and 364 nm or a solid state laser operating at a wavelength of 354.7 nm can be used. The exposures are made in half-inch squares (exposure regions) which are scanned out by drawing consecutive parallel lines approximately 50.8 micron apart on the surface of the liquid in the petri dish. Different exposure regions are exposed to different levels of known incident energy to obtain different cured thicknesses. The spot diameter at the liquid surface is approximately 0.0127 cm in diameter ($1/e^2$). After waiting at least 15 minutes for the exposed panels to harden, the panels are removed from the petri dish and excess, uncured resin is removed by blotting with a Kimwipe EX-L (Kimberly Clark). Film thickness is measured with a Mitutoyo Model ID-C112CE Indicator Micrometer. Film thickness is a linear function of the logarithm of the exposure energy; the slope of the regression is Dp (units of micron) and Ec is the x-axis intercept of the regression fit (units of $mJ/cm^2$).

Building Parts

Test formulations are selectively irradiated by a scanned laser beam to form the desired cross-section layer using a Somos Solid State Imager (SSI) or 3D Systems Viper SLA stereolithography machine. Both Viper SLA and SSI machines utilize a solid-state laser operating with an output of 354.7 nm. Laser spot diameter of SSI machine is 0.025 cm at the level of the liquid surface of the photopolymer. Unless otherwise noted, parts built on Viper SLA are fabricated by forming a series of 4 mil (0.1016 mm) coated layers, and giving enough imagewise exposure to each layer to create a cured polymer layer that corresponds to a 10 mil (0.254 mm) working curve thickness. The hatch overcure setting on the Viper machine was set to 0. Parts built using SSI machine are fabricated by forming a series of 5 mil layers to create a cured polymer layer that would correspond to a 10 mil (0.254 mm) working curve thickness (E10 exposure).

The exposure energy is determined by the laser power, the scanning speed, the laser pulse frequency and the scan line spacing. The exposure energy is adjusted to yield a target cured layer thickness (cure depth) based on the Ec and Dp values determined for the resin. The exposed layer is submerged under a layer of unpolymerized resin and the exposure step is repeated. These exposure and recoat steps are repeated until cured parts are obtained with the desired part thickness.

After the parts are formed they are cleaned in a solvent, allowed to dry, and then fully cured using a UV postcuring apparatus. Solvents used for rinsing included Tripropylene Glycol mono-methyl ether (TPM) and Isopropanol. Washing parts includes rinsing parts in TPM for a period of 15 minutes, followed by rinsing in Isopropanol for a period of 15 minutes. In this manner, care is taken to not overexpose green parts to solvents to a degree that adversely affects cured polymer properties. UV postcuring is performed using a Post Curing Apparatus manufactured by 3D Systems, Inc (PCA" sold by 3-D Systems, 10 bulb unit using Phillips TLQ05 40 W bulbs. These bulbs emit a broad spectrum of UV radiation with multiple peaks of UV output.). The postcuring consists of exposing the parts to 60 minutes of UV radiation at room temperature. The imaged parts are then allowed to condition at 25 C and 50% relative humidity for the period designated by the particular test that is to be performed. For most tests, except for ASTM D 256 Method A, this conditioning period lasted for 7 days.

Measurement of $T_g$ by Dynamic Mechanical Analysis

For Dynamic Mechanical Analysis (DMA), a petri dish holding ~40 g of a formulation is placed in the imaging region of a stereolithography machine and allowed to equilibrate at 30° C., 30% relative humidity. Thin strips (3-5) of width 7.7 mm, length 22 mm and a thickness of 0.25-0.5 mm are imaged onto the surface of the liquid formulation. Working curve analysis for each formulation is used to determine machine settings to image the resulting proper thickness. After a period of 15 minutes these thin strips are removed from the petri dish and liquid photopolymer is removed from the solid strip using Kimwipes and no solvent. These strips are placed on a non-adhesive surface such as a mylar film, and postcured in a Post Curing Apparatus (already described) for a period of 10 minutes per side. The strips are then placed in a controlled temperature/humidity environment (25° C., 50% relative humidity) for a period of 48 hours. Thickness of each strip is measured using a Mitutoyo micrometer (already described). A Rheometric Scientific Solid Analyzer model RSAII is used for DMA analyses. For DMA analyses, an oscillating frequency of 6.283 rad/sec is used in a temperature sweep experiment. E', E", and tan delta were monitored over a temperature range of −100° C. to 180° C. at a ramp rate of 5° C./min. Additional DMA settings are: initial static force of 100.0 g; Auto tension sensitivity of 1.0 g; static force>dynamic force of 20%; strain of 5.00e-4; soak time after ramp of 15 seconds; time per measurement of 5 seconds. After recording the temperature sweep experiment by the DMA analysis, $T_g$ of each formulation is determined by the peak tan delta of the experiment.

Tensile Testing

Dog-bone shaped tensile test specimens are built by multiple layer exposure. The samples are nominally 150 mm long, 10.15 mm wide in their narrow region and 3.8 mm thick. At least five specimens are built from each formulation. Specimens are cleaned, dried and subjected to UV postcure as described above. Specimens are placed in an environment controlled at 50% RH and 25° C. for seven days. Specimens are removed from the controlled environment immediately prior to testing. Width and thickness of each specimen are measured with a caliper.

Specimens are tested using an MTS Sintech tensile tester following the procedure of ASTM D638M. Samples are held in a set of wedge action grips with serrated faces; grip separation was 105 mm. Stress is measured with a 28.913 kN load cell and strain is measured with an extensometer set to initial gauge length of 25.4 mm. Stress and strain are recorded at a grip separation speed of 5.08 mm/minute. Young's Modulus, % Elongation at Yield, Yield Stress, % Elongation at Break and Break Stress are recorded for each specimen. For the purposes of this application % elongation is synonymous with % strain. The average of five specimens is reported. The Young's modulus is taken from the slope of the stress-strain curve between 0.05 and 0.25% elongation. The Yield Stress is taken from the maximum in the stress-strain curve (i.e. the Yield point), which usually is found between 2 and 8% elongation. If the sample fails at an elongation between 0 and 10%, without showing a maximum in the stress-strain curve, the maximum stress is taken as approximation for the Yield Stress. The % Elongation at Yield is the strain at the yield point. % Elongation at Break and the Break Stress are taken from the last data point before failure of the sample. Strain softening can be defined as a material's loss of resistance to applied stress after the yield point, and can be identified with a necking phenomenon in certain polymers. In systems where there is no appreciable strain hardening after necking occurs, strain softening can be conveniently calculated using the values for Yield stress and Break stress. Here the value for Strain softening is calculated using the following equation:

$$\frac{\text{Stress at Yield} - \text{Stress at Break}}{\text{Stress at Yield}} \times 100\%$$

Determination of 24-Hour Water Immersion Weight Gain

Specimens for water immersion are built on a Stereolithography machine as previously described, sample dimensions 3"×1"×⅛" (7.62 cm×2.54 cm×0.3175 cm). Specimens are built, washed and UV postcured as previously described. A minimum of 3 specimens, preferably at least 5, per test formulation are built, washed, and UV postcured. Specimens are numbered and allowed to condition at 23° C., 50% relative humidity for a period of 48 hours. Each specimen is then weighed accurately, each weight is recorded as the initial weight. Place 1000 g of deionized or distilled water into a 1 kg Nalgene jar. Test specimens are then immersed in the distilled water for a period of 24+/−0.5 hours, maintaining a temperature to 23° C.+/−2° C. When 24+/−0.5 hours have elapsed, remove the samples one at a time using the forceps and blot them on the wiping tissue. The samples are then reweighed as above and the final weight recorded.

Heat Deflection Temperature Testing

Heat Deflection Temperature (HDT) is tested on parts built, washed, and UV postcured, as previously described. Specimens are numbered and allowed to condition at 23° C., 50% relative humidity for a period of not less than 48 hours. Part dimensions and test method is as described in ASTM D648-00a Method B. Reported HDT values are for an applied stress of 0.45 MPa (66 psi). Care was taken to ensure that the test contacts for the HDT tester were in contact with smooth surfaces of the polymer part. It has been found that surface irregularities (i.e. non-smooth surfaces) can contribute to a lower HDT than measuring a smooth part surface. Top surfaces of HDT parts are typically smooth without alteration. Sidewalls and bottom-facing surfaces were sanded with 100 grit followed by 250 grit sandpaper to ensure a smooth testing surface before measurement. Listed HDT data are for parts that have not experienced thermal postcure.

Viscosity Measurement

The viscosity of a formulation is measured using a Paar Physica LC3 Viscometer operating at a shear rate of 50 s$^{-1}$ and using a Z3 cup, utilizing 14-16 g of material per measurement. All viscosity measurements are performed with the viscometer/sample equilibrated to 30° C.

Izod Impact

Izod impact testing provides an assessment of the ability of materials to withstand rapidly applied forces such as are encountered from falling objects, collisions, drops, etc. The test does not provide engineering data about a given material, rather it is best used to compare the impact resistance of materials formed into a specified specimen shape and tested under identical conditions.

When comparing the impact resistance of plastic materials, the notched Izod test, as described in ASTM D 256, is widely used. In this test, specimens are fabricated to a defined geometry and a notch is machined into one face of the specimen. The notch simulates the presence in a part of sharp corners, intersecting faces or machined features (such as tapped screw holes).

For the notched Izod test, the specimen is held vertically in a vise with the notch parallel to the top of the vise. A pendulum mounted hammer with a defined striking edge is released from a defined height and swings into the notched face of the specimen at a specified distance above the notch. The height attained by the hammer after shearing the specimen corresponds to the residual energy of the hammer. The hammer energy lost to the specimen accounts for the energy to make a crack at the notch tip, to propagate the crack and to propel the broken piece of the specimen away from the impact area. The impact energy is determined as the energy lost by the hammer minus the energy required to propel the broken piece from the specimen. Results from different materials should be compared only when the geometry, notching technique, notch radius, and testing conditions (equipment, temperature, etc.) are held constant.

Izod Impact Testing

Parts for impact resistance testing are built with dimensions specified in, machine notched, conditioned, and tested according to ASTM D 256 Method A. Test specimens were built by multiple layer exposure. The samples are nominally 63.5 mm long, 12.7 mm wide and 6.35 mm thick in conformity with ASTM D 256 Method A. At least five specimens are built from each formulation. Specimens are cleaned, dried and subjected to UV postcure as described above. Specimens are left at temperature and humidity controlled conditions for one day before notching (23-25 C, 50% relative humidity). Specimens are notched according to ASTM D 256 Method A using a CS-93M Sample Notcher from CSI. The notched samples are placed in an environment controlled at 50% RH and 20-23° C. for two days. Specimens are removed from the controlled environment immediately prior to testing. Izod Impact values are measured with a Zwick model 5110 impact tester fitted with a 2.75 J pendulum. It has been found that parts built with a preformed notch can display superior or exaggerated notched Izod impact strength values compared to parts with a machined notch in a given photopolymer formulation. All data listed are from specimens with a machined notch, as is specified in ASTM D 256 Method A.

Gardner Impact Tester

Test Methods: ASTM D 2794, Gardner model IG 1120 with 4 lb (1.82 kg) impacter was used. Gardner impact testing is used to establish quality standards for resistance to impact surface damage and penetration of many materials such as plastics, resins, fiberglass, sheet metals, plywood, etc. Samples of dimension 2"×2"×⅛" (50.8 mm×50.8 mm×3.175 mm) are built, washed, and postcured by the method described previously and conditioned at 23 C/50% Relative humidity for a period of 40-60 hours. A sample specimen is placed over a hole of 0.640 in. (1.63 cm) diameter in a die mounted in the Gardner tester anvil. The round nosed punch, 0.625 in (1.59 cm) diameter, is placed upon the specimen. The weight is raised to the desired height in the 40 in. or 100 cm graduated guide tube and dropped. Damage to the sample may be determined visually or with low power magnification or by using a Holiday detector. Weights of 2 and 4 pounds offer impact forces of 80 and 160 inch-lbs. respectively, while the 1 kg and 2 kg weights can exert forces of 100 kg-cm and 200 kg-cm. Gardner impact data are recorded for the maximum force of a sample before the sample of a given formulation will fracture due to impact. Gardner impact data values are assigned to a formulation for an impact energy at which 50% of the samples survive the test, per ASTM D2794.

Descriptions of the materials used in the examples can be found in Table 1, above. For the purposes of the following examples n/m means not measured.

Example compositions of the instant claimed invention can be found in Table 2, below. Each example compositions has an acceptable, or in some cases excellent, viscosity. Moreover, each composition can produce a cured three-dimensional article with an excellent combination of modulus, impact strength, heat deflection temperature, and water resistance.

TABLE 2

|  | Example 1 | Example 2 | Example 3 | Example 4 | Example 5 | Example 6 | Example 7 |
|---|---|---|---|---|---|---|---|
| UVR 6105 | 8.56 | 7.00 | 8.76 | 7.67 | 7.52 | 7.35 | 9.70 |
| Ebecryl 3605 |  | 2.00 |  | 1.98 | 1.94 | 1.90 |  |
| Epon 828 | 25.49 | 20.00 | 26.08 | 21.68 | 21.23 | 20.80 | 28.01 |
| Epalloy 5000 | 12.84 | 16.00 | 13.11 | 13.54 | 13.27 | 12.99 | 15.08 |
| OXT 101 | 10.27 | 18.00 | 10.46 | 14.88 | 14.58 | 14.28 | 18.72 |
| OXT 221 | 6.86 | 11.00 | 7.01 | 7.24 | 7.08 | 6.94 |  |
| OXT 212 | 0.75 |  |  | 1.00 | 3.01 | 5.00 |  |
| DCE 410 |  |  | 0.75 |  |  |  | 0.81 |
| Tripropylene glycol | 5.17 | 3.20 | 5.26 | 1.98 | 1.94 | 1.90 | 5.38 |
| SR399 |  |  | 2.00 |  |  |  | 2.16 |
| CN 110 | 10.27 |  | 10.46 |  |  |  | 11.31 |
| Ebecryl 3700 |  | 6.00 |  | 9.92 | 9.72 | 9.52 |  |
| SR 351 TMPTA | 4.28 | 2.00 |  | 3.97 | 3.89 | 3.81 |  |
| Irgacure 184 | 2.57 | 2.30 | 2.60 | 2.71 | 2.66 | 2.59 | 2.37 |
| Chivacure 1176 | 4.28 | 3.30 | 4.35 | 4.51 | 4.42 | 4.33 | 3.88 |
| Paraloid EXL2314 | 8.47 | 9.00 | 9.01 | 8.93 | 8.75 | 8.57 | 2.20 |
| Irganox 1035 |  |  |  |  |  |  | 0.11 |
| BYK 348 |  |  |  |  |  |  | 0.22 |
| Silwet 7600 | 0.17 | 0.18 | 0.13 |  |  |  |  |
| BYK 501 | 0.02 | 0.02 | 0.02 |  |  |  |  |
| V818 |  |  |  |  |  |  | 0.05 |
| Total | 100 | 100 | 100 | 100 | 100 | 100 | 100 |
| Z3, 30° C. visc, cP | 800 | 692 | 1237 | 772 | 668 | 644 | n/m |
| Modulus, MPa | 2465 | 2265 | 2616 | n/m | n/m | n/m | 2737 |
| Yield Stress, MPa | 48.4 | 45.4 | 49.6 | n/m | n/m | n/m | n/m |
| % Elongation at Break | 13.6 | 8.84 | 9.7 | n/m | n/m | n/m | 5.3 |
| Strain softening, % of Yield Stress | 26.5 | 25.9 | 26.6 | n/m | n/m | n/m | n/m |
| Gardner Impact, in-lb | 26 | 36 | 20 | n/m | n/m | n/m | 40 |
| Notched Izod Impact Strength, J/cm | 0.305 | n/m | 0.32 | 0.3 | 0.32 | 0.31 | 0.41 |
| HDT, ° C. (0.45 MPa load) | n/m | 56.1 | 56 | n/m | n/m | n/m | n/m |
| $T_g$, ° C. (DMA peak tan δ) | 62.9 | 53.6 | 59.4 | 46.6 | 45.3 | 44.5 | 52.8 |
| 24 h Water wt % gain | 0.607 | n/m | 0.385 | n/m | n/m | n/m | 0.352 |

Table 3, below, shows experimental results obtained from an example composition when cured using an SSI machine, in Example 8, and a Viper machine, in Example 9. The experimental results obtained in Example 8 and Example 9 are similar. However, when the liquid radiation curable resin was cured on the Viper machine, the impact strength was much greater. The increase in impact strength is believed to be a result of the increased resolution of the Viper machine. Both example compositions produce cured three-dimensional articles with an excellent overall combination of properties.

TABLE 3

|  | Example 8 | Example 9 |
|---|---|---|
| UVR 6105 | 9.2 | 9.2 |
| Epon 828 BisA DGE | 26.6 | 26.6 |
| Epalloy 5000 | 14.3 | 14.3 |
| OXT 101 hydroxy | 17.8 | 17.8 |
| DCE 410 | 0.8 | 0.8 |
| Tripropylene glycol | 5.1 | 5.1 |
| SR399 | 2.1 | 2.1 |
| CN 110 | 10.7 | 10.7 |
| Irgacure 184 | 2.3 | 2.3 |
| Chivacure 1176 | 3.7 | 3.7 |
| Paraloid EXL2314 | 7.2 | 7.2 |
| Irganox 1035 | 0.1 | 0.1 |
| Byk 348 | 0.2 | 0.2 |
| total | 100 | 100 |
| Z3, 30° C. visc, cP | 960 | same |
| Modulus, MPa | 2642 | 2781 |
| Yield Stress, MPa | 46 | 53.8 |
| % Elongation at Break | 8.6 | 6.5 |
| Strain softening, % of Yield Stress | 28.3 | 26.8 |
| Notched Izod Impact Strength, J/cm | 0.357 | 0.53 |
| HDT, ° C. (0.45 MPa load) | 55.2 | n/m |
| $T_g$, ° C. (DMA peak tan δ) | 50.2 | 55.2 |
| 24 h Water wt % gain | 0.42 | 0.46 |

Table 4, below, shows experimental results obtained from an example composition when cured using a SSI machine, in Example 10, and a Viper machine, in Example 11. The experimental results obtained in Example 10 and Example 11 are similar. Both example compositions produce cured three-dimensional articles with an excellent overall combination of properties.

TABLE 4

|  | Example 10 | Example 11 |
|---|---|---|
| UVR 6105 | 8.7 | 8.7 |
| Epon 828 BisA DGE | 26.0 | 26.0 |
| Epalloy 5000 | 13.1 | 13.1 |
| OXT 101 | 10.5 | 10.5 |
| OXT 221 | 7.0 | 7.0 |
| DCE 410 | 0.76 | 0.76 |
| Tripropylene glycol | 5.3 | 5.3 |
| SR399 | 2.0 | 2.0 |
| Aronix M-315 | 10.5 | 10.5 |
| Irgacure 184 | 2.6 | 2.6 |
| Chivacure 1176 | 4.4 | 4.4 |
| Paraloid EXL2314 | 9.0 | 9.0 |
| total | 100 | 100 |
| Z3, 30° C. visc, cP | 1237 | same |
| Modulus, MPa | 2617 | 2450 |
| Yield Stress, MPa | 49.6 | 45.9 |
| % Elongation at Break | 9.7 | 15.2 |
| Strain softening, % of Yield Stress | n/m | 28.9% |
| Notched Izod Impact Strength, J/cm | 0.32 | 0.31 |
| HDT, ° C. (0.45 MPa load) | n/m | 56 |
| $T_g$, ° C. (DMA peak tan δ) | 59.4 | n/m |
| 24 h Water wt % gain | 0.44 | 0.385 |

Table 5, below, shows the experimental results obtained from several comparative example compositions.

Comparative Example 1 is designed to replicate Example 5 of WO/2007/124911. Although the teaching of WO/2007/124911 yields compositions that produce articles with excellent modulus and impact strength, the composition exhibits undesirable viscosity and produces articles with undesirable 24-hour water absorption. Moreover, the heat deflection temperature of the article is somewhat low.

Comparative Example 2 is a composition with 32.5 wt % of a cycloaliphatic epoxide with a linking ester group. The articles produced by this comparative example composition produce outstanding impact resistance. However, the articles are very rubbery, as evidenced by the very low modulus, and have a very low $T_g$. The low $T_g$ indicates a similarly low heat deflection temperature.

Comparative Example 3 is designed to replicate Example 1 of WO/2008/115057. This composition produces articles with somewhat low heat deflection temperature, low impact strength, and undesirable water absorption results.

Comparative Example 4 is designed to replicate a variant of Example A of WO/2008/115057. This composition produces a liquid radiation curable resin with acceptable viscosity and produces articles with acceptable impact strength. However, these articles possess a somewhat low heat deflection temperature and modulus, and have undesirable water absorption characteristics.

Comparative Example 5 and Comparative Example 6 can be compared to example compositions of the instant claimed invention, however, both comparative example compositions lack a polyol. Although the compositions have excellent resistance to water uptake, both compositions produce articles with poor impact resistance.

TABLE 5

|  | Comparative Example 1 | Comparative Example 2 | Comparative Example 3 | Comparative Example 4 | Comparative Example 5 | Comparative Example 6 |
|---|---|---|---|---|---|---|
| UVR 6105 | 30.70 |  | 21 | 21 | 7.0 | 9.10 |
| UVR 6128 |  | 32.5 |  |  |  |  |
| Ebecryl 3605 | 11.60 | 11.6 |  |  |  |  |
| Epon 825 | 16.00 | 17 |  |  |  |  |
| Epon 828 |  |  | 6.2 | 10.0 | 37.5 | 27.10 |
| Epikote 806 |  |  | 6.2 | 10.0 |  |  |
| Epalloy 5000 |  |  |  |  | 20.2 | 13.65 |
| Epikote 834 |  |  | 12.5 | 5 |  |  |
| OXT 101 |  |  | 12.2 | 12.2 | 15.0 | 10.92 |
| OXT 221 |  |  |  |  |  | 7.29 |
| DCE 410 |  |  |  |  | 0.75 |  |
| Stepanpol PS2002 | 5.40 | 5 |  |  |  |  |
| Synfac 8025 | 13.00 | 12.3 |  |  |  |  |
| Triethylene glycol | 4.25 | 2.55 |  |  |  |  |
| PO modified trimethylolpropane |  |  | 8.4 |  |  |  |
| PTMG 650 |  |  |  | 8.4 |  |  |
| SR399 | 4.25 | 4.25 |  |  |  | 2 |

TABLE 5-continued

|  | Comparative Example 1 | Comparative Example 2 | Comparative Example 3 | Comparative Example 4 | Comparative Example 5 | Comparative Example 6 |
|---|---|---|---|---|---|---|
| CN 110 |  |  |  |  | 11 | 10.92 |
| Aronix M-315 |  |  | 12 | 12 |  |  |
| SR 351 TMPTA |  |  |  |  |  | 4.55 |
| Irgacure 184 | 2.30 | 2.3 | 2 | 2 | 2.4 | 2.73 |
| Chivacure 1176 | 3.30 | 3.3 |  |  | 3.9 | 4.55 |
| CP101A (equiv to Chiv 1176) |  |  | 4.6 | 4.5 |  |  |
| Paraloid EXL2314 | 9.00 | 9 |  |  |  | 9.00 |
| Elastomer particles (from MX-153) |  |  | 15 | 15 |  |  |
| Irganox 1035 |  |  |  |  | 0.1 |  |
| Byk 348 | 0.07 |  |  |  |  |  |
| Silwet 7600 | 0.13 | 0.1 |  |  |  | 0.18 |
| BYK 501 |  | 0.07 |  |  | 0.2 | 0.02 |
| total | 100 | 100 | 100 | 100 | 100 | 100 |
| Z3, 30° C. visc, cP | 1660 | n/m | n/m | n/m | 500 | 1526 |
| Z3, 25° C. visc, cP | n/m | n/m | 1150 | 580 | n/m | n/m |
| Modulus, MPa | 2549 | 528 | 2474 | 2149 | 3362 | 2507 |
| Yield Stress, MPa | 42 | n/m | n/m | n/m | 57 | 55.5 |
| % Elongation at Break | 13 | n/m | 24.3 | 34..4 | 2 | 6.55 |
| Strain softening, % of Yield Stress | 24.6 | n/m | n/m | n/m | n/m | 4.1 |
| Notched Izod Impact Strength, J/cm | 0.54 | 1.2 | 0.23 | 0.31 | 0.2 | 0.194 |
| HDT, ° C. (0.45 MPa load) | 44.6 | n/m | 43.7 | 45 | n/m | n/m |
| $T_g$, ° C. (DMA peak tan δ) | 37.9 | 32 | n/m | n/m | 48.5 | 95.4 |
| 24 h Water wt % gain | 1.2 | n/m | 0.9 | 0.8 | 0.27 | 0.202 |

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

While the invention has been described in detail and with reference to specific embodiments thereof, it will be apparent to one of ordinary skill in the art that various changes and modifications can be made therein without departing from the spirit and scope of the claimed invention.

What is claimed is:

1. A liquid radiation curable resin comprising:
    (A) from about 0 to about 12 wt % of a cycloaliphatic epoxide having a linking ester group;
    (B) from about 30 to about 65 wt % of one or more epoxy functional components, wherein element (B) is not the same as element (A);
    (C) from about 10 to about 30 wt % of one or more oxetanes;
    (D) from about 1 to about 10 wt % of one or more polyols;
    (E) from about 2 to about 20 wt % of one or more radically curable (meth)acrylate components;
    (F) from about 2 to about 12 wt % of one or more impact modifiers;
    (G) from about 0.1 to about 8 wt % of one or more free radical photoinitiators; and
    (H) from about 0.1 to about 8 wt % of one or more cationic photoinitiators;
   wherein the one or more epoxy functional components other than (A) comprises from about 0.25 wt % to about 1.0 wt % of a mono-functional epoxy with an ethylhexyl chain; and
   wherein the liquid radiation curable resin has a viscosity at 30° C. of from about 200 cps to about 1300 cps.

2. The liquid radiation curable resin of claim 1, comprising:
    (A) from about 5 to about 10 wt % of a cycloaliphatic epoxide having a linking ester group;
    (B) from about 35 to about 45 wt % of one or more epoxy functional components, wherein element (B) is not the same as element (A);

(C) from about 15 to about 30 wt % of one or more oxetanes;
(D) from about 1 to about 8 wt % of one or more polyols;
(E) from about 2 to about 20 wt % of one or more radically curable (meth)acrylate components;
(F) from about 2 to about 10 wt % of one or more impact modifiers; and
(G) from about 0.1 to about 5 wt % of one or more free radical photoinitiators.

3. The liquid radiation curable resin of claim 1 wherein the liquid radiation curable resin, after full cure, has a Young's modulus of from about 2 GPa to about 3 GPa, a notched Izod impact strength of from about 0.30 J/cm to about 0.60 J/cm, a heat deflection temperature of from about 40° C. to about 65° C., and a 24-hour water absorption value of from about 0.2 weight % to about 0.7 weight %.

4. The liquid radiation curable resin of claim 2 wherein the liquid radiation curable resin, after full cure, has a Young's modulus of from about 2 GPa to about 3 GPa, a notched Izod impact strength of from about 0.30 J/cm to about 0.60 J/cm, a heat deflection temperature of from about 40° C. to about 65° C., and a 24-hour water absorption value of from about 0.2 weight % to about 0.7 weight %.

5. The liquid radiation curable resin of claim 1 wherein the liquid radiation curable resin has a viscosity at 30° C. of from about 600 cps to about 1250 cps.

6. The liquid radiation curable resin of claim 1 wherein the liquid radiation curable resin, after full cure, has a Young's modulus of from about 2.25 GPa to about 2.80 GPa.

7. The liquid radiation curable resin of claim 1 wherein the liquid radiation curable resin, after full cure, has a notched Izod impact strength of from about 0.30 J/cm to about 0.53 J/cm.

8. The liquid radiation curable resin of claim 1 wherein the liquid radiation curable resin, after full cure, has a heat deflection temperature of from about 55° C. to about 65° C.

9. The liquid radiation curable resin of claim 1 wherein the liquid radiation curable resin, after full cure, has a 24-hour water absorption value of from about 0.20 to about 0.61 weight %.

10. The liquid radiation curable resin of claim 1 wherein the liquid radiation curable resin, after full cure, has a strain softening value of from about 20 to about 30% of yield stress.

11. The liquid radiation curable resin of claim 1 wherein the one or more radically curable (meth)acrylate components comprises one or more components with at least two (meth)acrylate groups.

12. The liquid radiation curable resin of claim 1 wherein the one or more impact modifiers comprises one or more elastomers.

13. The liquid radiation curable resin of claim 1 wherein the one or more oxetane functional components comprises from about 0.25 wt % to about 5.0 wt % of a mono-functional oxetane with an ethylhexyl chain.

14. The liquid radiation curable resin of claim 1 wherein the one or more impact modifiers comprises an impact modifier with a dispersed average particle size of from about 50 nm to about 850 nm.

15. The liquid radiation curable resin of claim 1 wherein the one or more impact modifiers comprises a first impact modifier and a second impact modifier wherein the dispersed average particle size of the first impact modifier is different than the dispersed average particle size of the second impact modifier.

16. The liquid radiation curable resin of claim 15 wherein the ratio of diameters of the first impact modifier to the second impact modifier is about 7 to 1 and the ratio of the presence in the liquid radiation curable resin in terms of weight percent of the entire composition of the first impact modifier to the second impact modifier is about 4 to 1.

17. The liquid radiation curable resin of claim 1 wherein the cationically polymerizable/hydroxy ratio of the liquid radiation curable resin is from about 2.0 to about 4.0.

18. A process for making a three-dimensional article comprising the steps of
(1) providing a liquid radiation curable resin;
(2) providing a stereolithography machine;
(3) coating a layer of a liquid radiation curable resin onto a surface;
(4) exposing said layer imagewise to actinic radiation to form a first exposed imaged cross-section, wherein the radiation is of sufficient intensity and time to cause substantial curing of the layer in the exposed areas;
(5) coating an additional layer of the liquid radiation curable resin onto the previously exposed imaged cross-section;
(6) exposing said additional layer imagewise to actinic radiation to form an additional imaged cross-section, wherein the radiation is of sufficient intensity and time to cause substantial curing of the second layer in the exposed areas and to cause adhesion to the previously exposed imaged cross-section; and
(7) repeating steps (5) and (6) a desired number of times to build up the three-dimensional article,
wherein the liquid radiation curable resin is that of claim 1.

19. A three-dimensional article made by a process of claim 18, after full cure, has a Young's modulus of from about 2 GPa to about 3 GPa, a notched Izod impact strength of from about 0.30 J/cm to about 0.60 J/cm, a heat deflection temperature of from about 40° C. to about 65° C., and a 24-hour water absorption value of from about 0.2 weight % to about 0.7 weight %.

20. A three-dimensional article made from the liquid radiation curable resin of claim 1.

21. A three-dimensional article made from the liquid radiation curable resin of claim 1 that, after full cure,
has a Young's modulus of from about 2 GPa to about 3 GPa,
a notched Izod impact strength of from about 0.30 J/cm to about 0.60 J/cm,
a heat deflection temperature of from about 40° C. to about 65° C., and
a 24-hour water absorption value of from about 0.2 weight % to about 0.7 weight %.

* * * * *